(12) United States Patent
Fujimori et al.

(10) Patent No.: US 9,997,682 B2
(45) Date of Patent: Jun. 12, 2018

(54) LIGHT EMITTING ELEMENT UNIT AND METHOD FOR MANUFACTURING THE SAME, LIGHT EMITTING ELEMENT PACKAGE AND ILLUMINATING DEVICE

(71) Applicant: ROHM CO., LTD., Kyoto (JP)

(72) Inventors: Takao Fujimori, Kyoto (JP); Yasuo Nakanishi, Kyoto (JP); Nobuaki Matsui, Kyoto (JP); Hirotaka Obuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days. days.

(21) Appl. No.: 14/730,796

(22) Filed: Jun. 4, 2015

(65) Prior Publication Data

US 2015/0270461 A1    Sep. 24, 2015

Related U.S. Application Data

(62) Division of application No. 13/339,060, filed on Dec. 28, 2011, now Pat. No. 9,082,945.

(30) Foreign Application Priority Data

Dec. 28, 2010 (JP) ................................. 2010-293739

(51) Int. Cl.
 *H01J 1/62* (2006.01)
 *H01L 33/60* (2010.01)
 (Continued)

(52) U.S. Cl.
 CPC ............ *H01L 33/60* (2013.01); *H01L 33/486* (2013.01); *H01L 33/62* (2013.01); *F21V 7/00* (2013.01); *H01L 2224/16225* (2013.01)

(58) Field of Classification Search
 None
 See application file for complete search history.

(56) References Cited

U.S. PATENT DOCUMENTS 5,418,384 A    5/1995   Yamana et al.
6,531,328 B1   3/2003   Chen
             (Continued)

FOREIGN PATENT DOCUMENTS

JP      62-108585 A    5/1987
JP      S62-124780 A   6/1987
             (Continued)

*Primary Examiner* — Andrew Coughlin
(74) *Attorney, Agent, or Firm* — Rabin & Berdo, P.C.

(57) ABSTRACT

A light emitting element unit according to the present invention includes a semiconductor light emitting element that has a surface, a back surface, and a side surface, where the surface or the back surface is a light extracting surface from which light generated inside is emitted, a submount which has a bottom wall and a side wall, has a recess portion defined by the bottom wall and the side wall, and supports the semiconductor light emitting element by the bottom wall in a position in which the light extracting surface is directed upward at the recess portion, and has an inclined surface on the side wall, inclined at a predetermined angle with respect to the bottom wall so as to face the side surface of the semiconductor light emitting element, and a light reflecting film formed on the inclined surface of the submount.

13 Claims, 17 Drawing Sheets

(51) Int. Cl.
*H01L 33/48* (2010.01)
*H01L 33/62* (2010.01)
*F21V 7/00* (2006.01)

(56) References Cited

U.S. PATENT DOCUMENTS

| | | | |
|---|---|---|---|
| 6,614,103 B1* | 9/2003 | Durocher | H01L 23/13 257/103 |
| 7,648,775 B2* | 1/2010 | Wakako | H01L 33/60 428/220 |
| 7,687,815 B2* | 3/2010 | Kim | H01L 33/486 257/291 |
| 2005/0023548 A1 | 2/2005 | Bhat et al. | |
| 2006/0001055 A1* | 1/2006 | Ueno | H01L 33/60 257/257 |
| 2006/0034084 A1 | 2/2006 | Matsuura et al. | |
| 2006/0101757 A1 | 5/2006 | Tsuzuki et al. | |
| 2006/0180828 A1 | 8/2006 | Kim et al. | |
| 2006/0220053 A1 | 10/2006 | Furukawa et al. | |
| 2007/0194336 A1 | 8/2007 | Shin et al. | |
| 2007/0228386 A1* | 10/2007 | Shie | H01L 33/486 257/79 |
| 2007/0246714 A1* | 10/2007 | Koike | H01L 25/0753 257/79 |
| 2008/0101071 A1 | 5/2008 | Imai et al. | |
| 2009/0026472 A1 | 1/2009 | Yasuda et al. | |
| 2010/0123161 A1 | 5/2010 | Takeuchi et al. | |
| 2011/0073883 A1 | 3/2011 | Osawa et al. | |

FOREIGN PATENT DOCUMENTS

| | | |
|---|---|---|
| JP | 05-029650 A | 2/1993 |
| JP | 05-316296 A | 11/1993 |
| JP | 06-016979 A | 1/1994 |
| JP | 11-289110 A | 10/1999 |
| JP | 2003-008078 A | 1/2003 |
| JP | 2005-057265 A | 3/2005 |
| JP | 2005-354067 A | 12/2005 |
| JP | 2006-012859 A | 1/2006 |
| JP | 2006-019666 A | 1/2006 |
| JP | 2006-041133 A | 2/2006 |
| JP | 2006-108333 A | 4/2006 |
| JP | 2006-237156 A | 9/2006 |
| JP | 2007-005091 A | 1/2007 |
| JP | 2007-027521 A | 2/2007 |
| JP | 2007-036253 A | 2/2007 |
| JP | 2007-157805 A | 6/2007 |
| JP | 2007-208136 A | 8/2007 |
| JP | 2008-034530 A | 2/2008 |
| JP | 2008-135588 A | 6/2008 |
| JP | 2008-135694 A | 6/2008 |
| JP | 2008-188955 A | 8/2008 |
| JP | 2009-212287 A | 9/2009 |
| JP | 2009-212394 A | 9/2009 |
| JP | 2010-010655 A | 1/2010 |
| JP | 2010-015709 A | 1/2010 |
| JP | 2010-027449 A | 2/2010 |
| JP | 2010-123742 A | 6/2010 |
| JP | 2010-140942 A | 6/2010 |

* cited by examiner

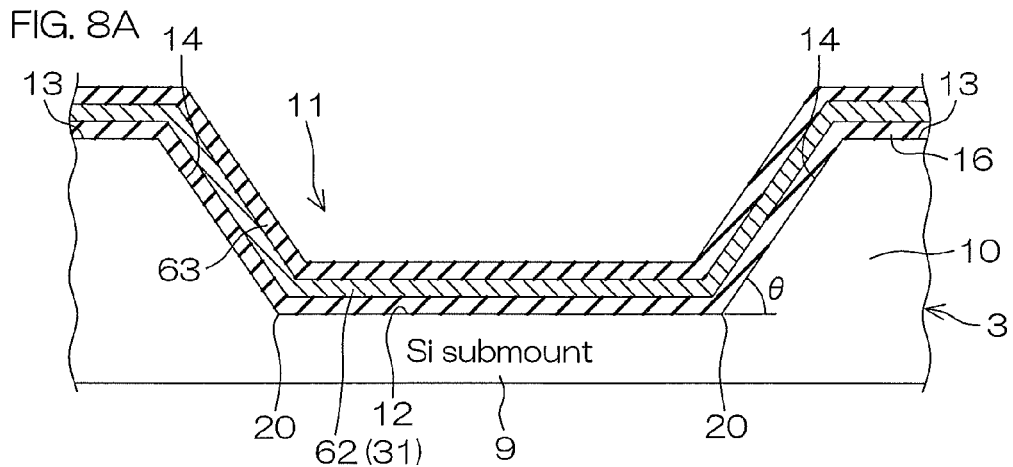
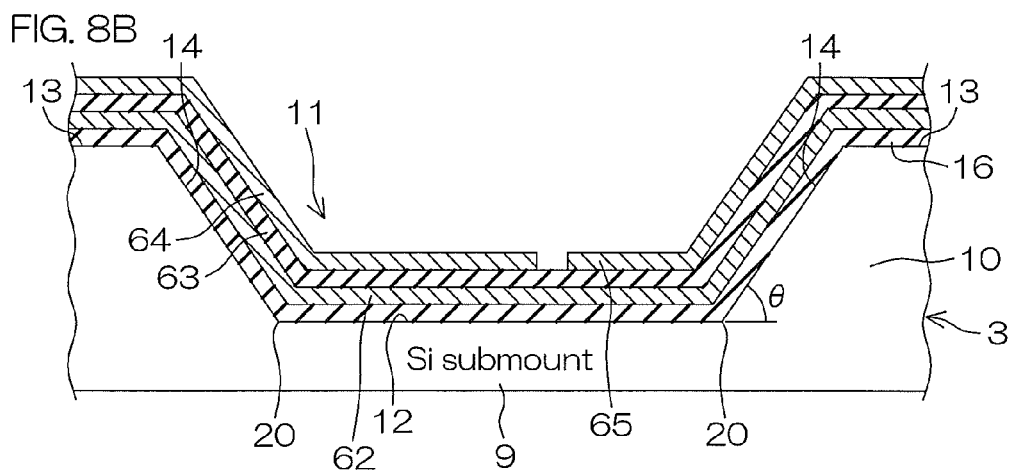
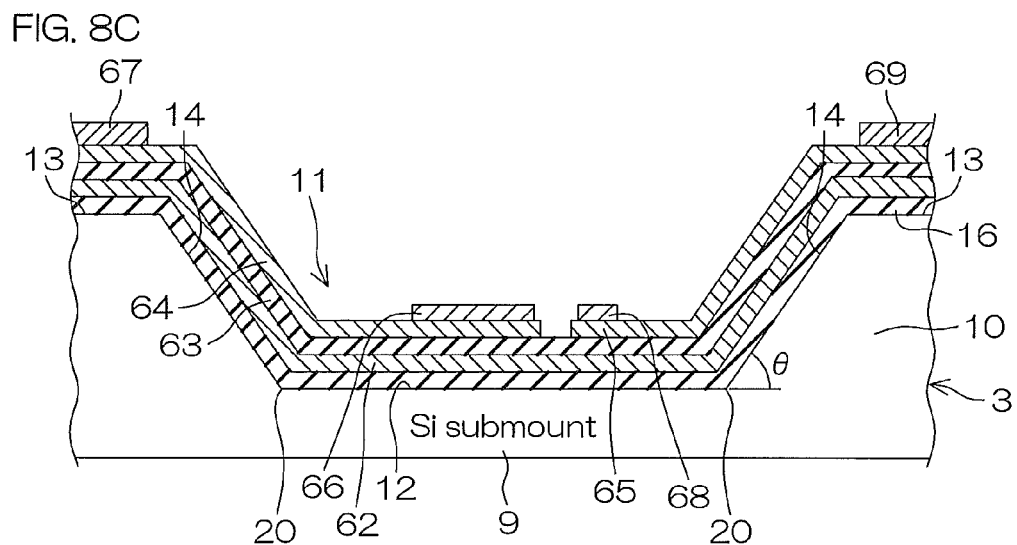

LIGHT EMITTING ELEMENT UNIT AND METHOD FOR MANUFACTURING THE SAME, LIGHT EMITTING ELEMENT PACKAGE AND ILLUMINATING DEVICE

CROSS-REFERENCE TO RELATED APPLICATION

This is a divisional application of U.S. application Ser. No. 13/339,060, filed Dec. 28, 2011 and allowed on Mar. 6, 2015, which claim priority to Japanese Application No. 2010-293739, filed Dec. 28, 2010. The disclosures of these U.S. and Japanese applications are incorporated herein by reference.

BACKGROUND OF THE INVENTION

Field of the Invention

The present invention relates to a light emitting element unit and a method for manufacturing the same, and a light emitting element package and an illuminating device including the light emitting element.

Description of Related Art

A known semiconductor light emitting device is disclosed in, for example, Patent Document 1. The semiconductor light emitting device includes a light emitting element, a zener diode that supports the light emitting element and is larger in size than the light emitting element, a mount portion having a bottom wall supporting the zener diode and a side wall standing from the bottom wall along the side surfaces of the light emitting element, a resin mold filled from the bottom portion of the mount portion to a portion near the lower end of the light emitting element, and an epoxy resin sealing the whole of these.

In the semiconductor light emitting device described in Patent Document 1 (Japanese Published Unexamined Patent Application No. H11-289110), light emitted from the peripheral surface of the light emitting element is reflected by the upper surface of the resin mold, and the reflected light is reflected by the side wall of the cone-shaped mount portion. Accordingly, light from the peripheral surface of the light emitting element is collected as light in the same direction as the emitting direction of light from a principal light extracting surface.

SUMMARY OF THE INVENTION

However, the mount portion is designed so that a large-sized zener diode supporting the light emitting element is mounted thereon together with the light emitting element. Therefore, the position of the side wall of the mount portion that reflects the light from the peripheral surface of the light emitting element is limited to a position spaced from the zener diode.

Essentially, the distance between the peripheral surface of the light emitting element and the side wall of the mount portion can be short if only reflection of light from the light emitting element is considered, however, due to the limitation of the position of the side wall of the mount portion, the distance is longer than necessary. Therefore, the light emitted from the light emitting element attenuates until reaching the side wall of the mount portion, so that a loss until the reflected light is extracted is great.

An object of the present invention is to provide a light emitting element unit and a method for manufacturing the same, and a light emitting element package and an illuminating device including the light emitting element, with which light from the side surface of a semiconductor light emitting element can be efficiently extracted and the brightness can be improved.

The above-described or other objects, features, and effects of the present invention will be clarified from the description of preferred embodiments given below with reference to the accompanying drawings.

BRIEF DESCRIPTION OF THE DRAWINGS

FIG. 8A to FIG. 8E are schematic sectional views showing parts of a manufacturing process of the LED element unit shown in FIG. 7 in order of steps.

DETAILED DESCRIPTION OF PREFERRED EMBODIMENTS

Figure 1:
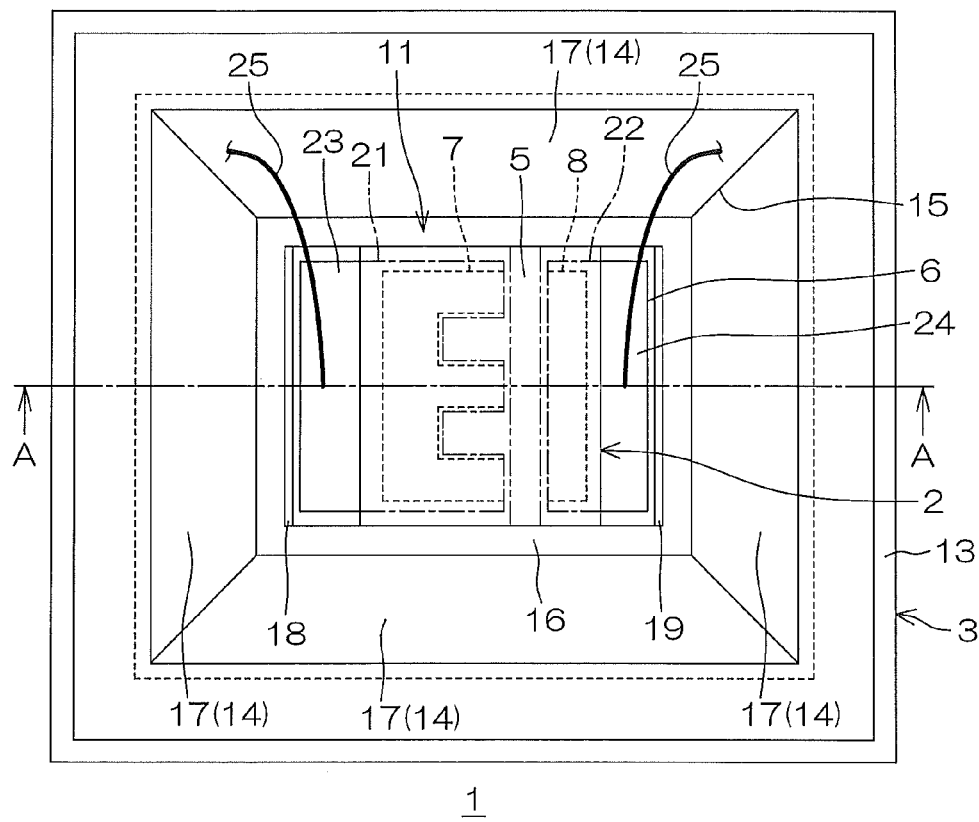
FIG. 1 is a schematic plan view of an LED element unit according to a first preferred embodiment of the present invention.

A light emitting element unit according to the present invention for achieving the above-described object includes a semiconductor light emitting element that has a surface, a back surface, and a side surface, where the surface or the back surface is a light extracting surface from which light generated inside is emitted, a submount which has a bottom wall and a side wall, has a recess portion defined by the bottom wall and the side wall, and supports the semiconductor light emitting element by the bottom wall in a position in which the light extracting surface is directed upward at the recess portion, and has an inclined surface on the side wall, inclined at a predetermined angle with respect to the bottom wall so as to face the side surface of the semiconductor light emitting element, and a light reflecting film formed on the inclined surface of the submount.

With the configuration, on the recess portion of the submount, an inclined surface is formed to face the side surface of the semiconductor light emitting element. A light reflecting film is formed on the inclined surface. By the inclined surface (light reflecting film), light exiting from the side surface of the semiconductor light emitting element can be reflected in the same direction as the emitting direction of the light from the light extracting surface. As a result, reflected light can be extracted as light contributing to the brightness of the semiconductor light emitting element.

Further, the inclined surface is formed on the side wall of the submount supporting the semiconductor light emitting element, so that the distance D between the side surface of the semiconductor light emitting element and the inclined surface can be designed according to the size of the semiconductor light emitting element. Therefore, by setting the distance D to an appropriate distance, before light exiting from the side surface of the semiconductor light emitting element attenuates, the light can be reflected by the inclined surface (light reflecting film). As a result, a loss until the reflected light is extracted can be reduced, and the light from the side surface of the semiconductor light emitting element can be efficiently extracted. Therefore, the brightness of the semiconductor light emitting element can be improved.

It is possible that the submount is formed to have a vessel shape so that the side wall has an annular shape surrounding the bottom wall in a plan view, the inclined surface is formed to surround the semiconductor light emitting element, and the light reflecting film is formed along the circumferential direction of the inclined surface.

With the configuration, the light reflecting film is formed along the circumferential direction of the inclined surface surrounding the semiconductor light emitting element. Therefore, light exiting from the side surface of the semiconductor light emitting element can be uniformly extracted. As a result, the brightness of the semiconductor light emitting element can be further improved.

It is also possible that the light emitting element unit according to the present invention further includes an insulating film formed on the light reflecting film, and an anode wiring and a cathode wiring which are made of a conductive material capable of reflecting light, and formed on the insulating film so as to lie across the bottom wall, the inclined surface, and a top portion of the side wall of the submount, and whose portions above the bottom wall are electrically connected to an anode and a cathode of the semiconductor light emitting element, respectively.

With the configuration, the anode wiring and the cathode wiring are laid along the inclined surface by using a conductive material capable of reflecting light, and pulled out to the top portion of the side wall of the submount. Accordingly, wires, etc., for supplying electric power to the anode and the cathode of the semiconductor light emitting element can be connected to the top portion of the submount. Therefore, light from the side surface of the semiconductor light emitting element can be prevented from colliding with obstacles such as wires before reaching the inclined surface (light reflecting film). As a result, a loss to be caused by collision with obstacles can be reduced, so that light from the side surface of the semiconductor light emitting element can be more efficiently extracted. In addition, the anode wiring and the cathode wiring are made of a conductive material capable of reflecting light, so that light colliding with these wirings can be reflected in the same direction as the emitting direction of light from the light extracting surface.

In the light emitting element unit according to the present invention, the light reflecting film may be exposed inside the recess portion, and in this case, it is preferable that the light emitting element unit further includes an anode pad and a cathode pad that are made of the same material as that of the light reflecting film, formed on the bottom wall of the submount so as to be separated from the exposed light reflecting film, and electrically connected to the anode and the cathode of the semiconductor light emitting element, respectively.

With the configuration, the light reflecting film is exposed inside the recess portion, so that light from the side surface of the semiconductor light emitting element can be directly irradiated onto the light reflecting film. Therefore, the light reflectance can be improved. The anode pad and the cathode pad are made of the same material as that of the light reflecting film, so that in the manufacturing process of the light emitting element unit, by utilizing a known semiconductor device manufacturing technology such as photolithography, the light reflecting film and the anode pad and cathode pad can be easily manufactured simultaneously.

It is also possible that the submount is formed to have a half-pipe shape concave in a side view, having a pair of the side walls opposed to each other across the bottom wall, and the inclined surface includes a pair of first inclined surface and second inclined surface opposed to each other across the semiconductor light emitting element, the light reflecting film includes an anode side reflecting film that is formed to be exposed inside the recess portion across the bottom wall, the first inclined surface, and the top portion of the side wall of the submount, and includes integrally a first reflecting portion formed on the first inclined surface and an anode connecting portion formed on the bottom wall and electrically connected to the anode of the semiconductor light emitting element, and a cathode side reflecting film that is formed to be exposed inside the recess portion across the bottom wall, the second inclined surface, and the top portion of the side wall of the submount, includes integrally a second reflecting portion formed on the second inclined surface and a cathode connecting portion formed on the bottom wall and electrically connected to the cathode of the semiconductor light emitting element, and is separated from the anode side reflecting film.

With the configuration, the first reflecting portion of the anode side reflecting film and the second reflecting portion of the cathode side reflecting film are exposed along the inclined surface, so that light from the side surface of the semiconductor light emitting element can be directly irradiated onto these reflecting films. Therefore, the light reflectance can be improved.

Further, the anode side reflecting film has the anode connecting portion integrally with the first reflecting portion, and is pulled out to the top portion of the side wall of the submount by utilizing the first reflecting portion. The cathode side reflecting film has the cathode connecting portion integrally with the second reflecting portion, and is pulled out to the top portion of the side wall of the submount by utilizing the second reflecting portion. Accordingly, wires, etc., for supplying electric power to the anode and cathode of the semiconductor light emitting element can be connected to the top portion of the submount. Therefore, light from the side surface of the semiconductor light emitting element can be prevented from colliding with obstacles such as wires before reaching the inclined surface (light reflecting film). As a result, a loss to be caused by collision with obstacles can be reduced, so that light from the side surface of the semiconductor light emitting element can be more efficiently extracted.

Specifically, with the configuration, the anode side reflecting film and the cathode side reflecting film exposed inside the recess portion commonly serve as an anode wiring and a cathode wiring, respectively. Accordingly, an effect of improvement in reflectance according to exposure of the reflecting film and an effect of reduction in loss of light according to the laying of wirings from the bottom wall to the top portion of the side wall of the submount can be realized simultaneously. Therefore, unlike the aforementioned submount, even if the light reflecting film is not formed to surround the semiconductor light emitting element, the light can be efficiently extracted.

In the light emitting element unit according to the present invention, the semiconductor light emitting element may be formed to have a rectangular shape in a plan view, and in this case, it is preferable that the anode and the cathode are formed adjacent to each other along the longitudinal direction of the semiconductor light emitting element on the semiconductor light emitting element, and the anode connecting portion and the cathode connecting portion are formed adjacent to each other at a distance from each other along the axial direction of the half-pipe-shaped submount.

With the configuration, the first reflecting portion of the anode side reflecting film and the second reflecting portion of the cathode reflecting film face the side surfaces along the longitudinal direction of the semiconductor light emitting element. Accordingly, lights from side surfaces along the longitudinal direction from which the emitting amount is relatively larger than that from the side surfaces along the width direction of the semiconductor light emitting element can be reflected. Therefore, the light extraction amount (absolute amount) from the side surfaces can be increased.

The inclination angle of the inclined surface with respect to the bottom wall of the submount is, for example, 30 to 80 degrees, preferably 40 to 70 degrees, more preferably 45 to 65 degrees, particularly preferably 50 to 60 degrees, and most preferably 53 to 57 degrees.

The recess portion may be filled with a resin phosphor. Specifically, in the light emitting element unit according to the present invention, the recess portion is filled with a resin phosphor, and even when slight attenuation of light due to the resin phosphor is a concern, a decrease in light extraction amount can be reduced by the effect of reflection by the light reflecting film formed on the inclined surface of the submount.

The light reflecting film may be made of aluminum (Al).

The light reflecting film may be made of an alloy containing silver (Ag), a platinum group metal, and copper (Cu). In this case, the platinum group metal is preferably platinum (Pt) or palladium (Pd).

It is also possible that the back surface of the semiconductor light emitting element is a light extracting surface, and the semiconductor light emitting element is supported by the submount in a face-down position in which the surface is directed downward. It is also possible that the surface of the semiconductor light emitting element is a light extracting surface, and the semiconductor light emitting element is supported by the submount in a face-up position in which the surface is directed upward.

A light emitting element package according to the present invention for achieving the above-described object includes the light emitting element unit, a base substrate supporting the light emitting element unit, and a resin case that is formed on the base substrate and surrounds the light emitting element unit.

With the configuration, the light emitting element unit according to the present invention is used, and the light extraction efficiency from the semiconductor light emitting element is high, so that a high-brightness light emitting element package can be provided.

An illuminating device according to the present invention for achieving the above-described object includes a long and thin support bar, and the light emitting element units aligned along the longitudinal direction of the support bar.

With the configuration, the light emitting element units according to the present invention are used, and the light extraction efficiency from the semiconductor light emitting elements is high, so that a high-brightness illuminating device can be provided.

A method for manufacturing a light emitting element unit according to the present invention for achieving the above-described object includes the steps of forming a recess portion and, simultaneously, an inclined surface inclined at a predetermined angle with respect to a bottom wall that partitions the recess portion from the back surface side, on the recess portion side of a side wall that partitions the recess portion from the lateral side, by selectively wet-etching an Si substrate having a surface and a back surface from the surface side, forming a light reflecting film on the inclined surface, and mounting a semiconductor light emitting element which has a surface, a back surface, and a side surface, and whose surface or back surface is a light extracting surface from which light generated inside is emitted, on the bottom wall of the Si substrate so that the light extracting surface faces upward and the side surface faces the inclined surface.

With the method, the recess portion is formed by wet-etching the Si substrate, so that when forming the recess portion, the Si crystal is anisotropically etched. Accordingly, on the side wall of the Si substrate that partitions the recess portion from the lateral side, the inclined surface can be easily formed.

The step of forming the recess portion may include a step of forming a first mask annular in a plan view on the surface along the peripheral edge portion of the Si substrate, and a step of processing the Si substrate into a vessel shape so that the side wall is formed to have an annular shape in a plan view surrounding the bottom wall by wet-etching from the surface of the Si substrate exposed from the first mask.

With the method, the inclined surface is formed to surround the recess portion, so that the light reflecting film can be formed along the circumferential direction of the inclined surface. Accordingly, the light emitting element unit from which light exiting from the side surface of the semiconductor light emitting element can be uniformly extracted can be easily manufactured.

When the Si substrate has a tetragonal shape in a plan view, the step of forming the recess portion may include a step of forming a second mask on the surface along peripheral edge portions opposed to each other of the Si substrate, and a step of processing the Si substrate into a half-pipe shape concave in a side view so that a pair of the side walls are opposed to each other across the bottom wall by wet-etching from the surface of the Si substrate exposed from the second mask.

The step of forming the light reflecting film may include a step of forming a conductive material capable of reflecting light across the bottom wall, the inclined surface, and the top portion of the side wall of the Si substrate, and a step of forming a first reflecting film across the bottom wall, the inclined surface, and the top portion of the side wall of the Si substrate, and, simultaneously, a second reflecting film separated from the first reflecting film and laid across the bottom wall, the inclined surface, and the top portion of the side wall of the Si substrate by patterning the conductive material on the Si substrate.

With the method, the light emitting element unit including an anode side reflecting film (for example, a first reflecting film) including a first reflecting portion and an anode connecting portion integrally, and a cathode side reflecting film (for example, a second reflecting film) including a second reflecting portion and a cathode connecting portion integrally, can be manufactured. Further, the first reflecting film and the second reflecting film are formed simultaneously, so that the manufacturing process can be simplified.

The method for manufacturing the light emitting element unit according to the present invention may further include a step of forming an insulating film on the light reflecting film, and a step of forming simultaneously a first wiring and a second wiring separated from each other by forming a conductive material capable of reflecting light on the insulating film so as to lie across the bottom wall, the inclined surface, and the top portion of the side wall of the Si substrate.

With the method, the light emitting element unit including an anode wiring (for example, a first wiring) and a cathode wiring (for example, a second wiring) separately from the light reflecting film can be manufactured. Further, the first wiring and the second wiring are formed simultaneously, so that the manufacturing process can be simplified.

Further, the step of forming the light reflecting film may include a step of forming a conductive material capable of reflecting light across the bottom wall, the inclined surface, and the top portion of the side wall of the Si substrate, and a step of forming the light reflecting film on the inclined surface, and, simultaneously, a first pad and a second pad separated from the light reflecting film and separated from each other on the bottom wall of the Si substrate by patterning the conductive material on the Si substrate.

With the method, the light emitting element unit including an anode pad (for example, a first pad) and a cathode pad (for example, a second pad) can be manufactured. Further, the light reflecting film, the first pad, and the second pad are formed simultaneously, so that the manufacturing process can be simplified.

Hereinafter, preferred embodiments of the present invention are described in detail with reference to the accompanying drawings.

First Preferred Embodiment

Figure 2:
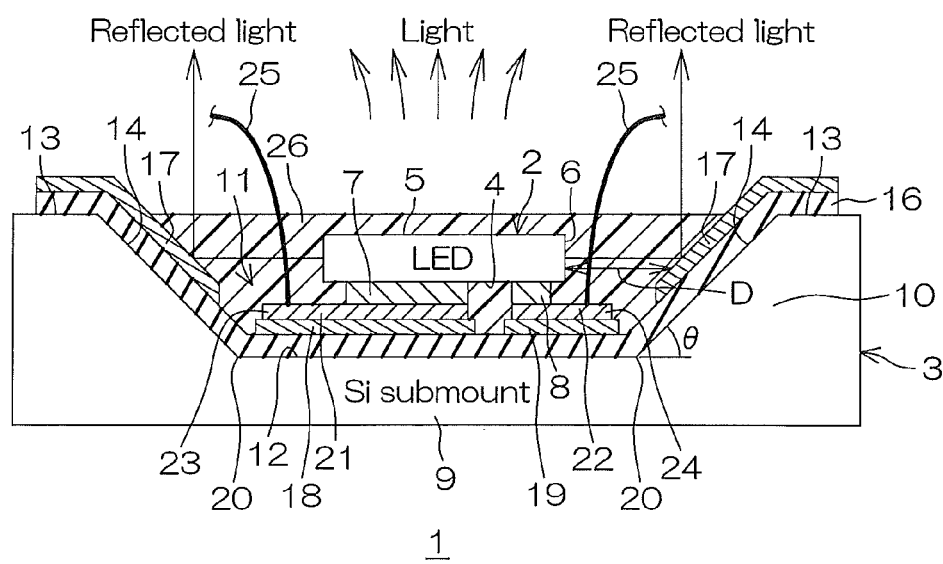
FIG. 2 is a sectional view of the LED element unit shown in FIG. 1, illustrating a section taken along line A-A in FIG. 1.

FIG. 1 is a schematic plan view of an LED element unit according to a first preferred embodiment of the present invention. FIG. 2 is a sectional view of the LED element unit shown in FIG. 1, illustrating a section taken along line A-A in FIG. 1

The LED element unit 1 as a light emitting element unit includes an LED chip 2 as a semiconductor light emitting element and a Si submount 3 supporting the LED chip 2.

The LED chip 2 is formed to have a polyhedral shape (rectangular parallelepiped shape in FIG. 1 and FIG. 2) having a surface 4, a back surface 5, and side surfaces 6, and for example, formed by forming a light emitting diode structure including a group-III nitride semiconductor layer on the surface side of a sapphire substrate as a transparent substrate. Light generated inside the LED chip 2 is transmitted through the sapphire substrate forming the back surface 5 and emitted. Specifically, in the LED chip 2, the back surface 5 is a light extracting surface.

On the surface 4 of the LED chip 2, an anode electrode 7 and a cathode electrode 8 are provided adjacent to each other. The anode electrode 7 and the cathode electrode 8 are made of, for example, silver (Ag), titanium (Ti), or platinum (Pt), or an alloy of these. The anode electrode 7 and the cathode electrode 8 may be made of solder or AuSn. In a plan view, the anode electrode 7 has a substantially E shape, and the cathode electrode 8 has a substantially I shape.

The Si submount 3 is formed by using a Si substrate 29 whose principal surface is the surface (100), and is rectangular in a plan view. The Si submount 3 is formed to have a vessel shape that has a bottom wall 9 and a side wall 10 having a tetragonal ring shape in a plan view surrounding the bottom wall 9, and a recess portion 11 formed at a portion surrounded by the bottom wall 9 and the side wall 10. Specifically, the recess portion 11 is defined by the bottom wall 9 and the side wall 10 of the Si submount 3. The surface (the bottom surface 12 of the Si submount 3) facing the recess portion 11 of the bottom wall 9 is the surface (100).

The surfaces facing the recess portion 11 of the side wall 10 of the Si submount 3 are formed of four planes each of which shares one side with each of the four top surfaces 13 forming a pair of long sides and a pair of short sides of the side wall 10 in a plan view. These four planes are inclined surfaces 14 (tapering surfaces) so that the distance between two planes opposed to each other narrows toward the bottom wall 9. Between the inclined surfaces 14 adjacent to each other, ridge lines 15 extending at four corners of the side wall 10 are formed.

Each inclined surface 14 is inclined at an angle θ with respect to the bottom surface 12 of the Si submount 3. The angle θ is, for example, 30 to 80 degrees, preferably 40 to 70 degrees, more preferably 45 to 65 degrees, particularly preferably 50 to 60 degrees, and most preferably 53 to 57 degrees.

On the surface of the Si sub-mount 3, an insulating film 16 (oxide film) made of $SiO_2$ is formed. The insulating film 16 is formed across the bottom surface 12, the inclined surfaces 14, and the top surfaces 13 of the side wall 10 so as to cover the entire region of the bottom surface 12 and the inclined surfaces 14 of the Si submount 3 integrally.

On the insulating film 16, a light reflecting film 17, an anode pad 18, and a cathode pad 19 are formed separately from each other. The light reflecting film 17, the anode pad 18, and the cathode pad 19 are made of the same material, and specifically, made of aluminum (Al) as a conductive material capable of reflecting light.

The light reflecting film 17, the anode pad 18, and the cathode pad 19 may be made of an alloy containing silver (Ag), a platinum (Pt) group metal, and copper (Cu). As the platinum group metal, platinum (Pt) or palladium (Pd) can be used. The blend proportions of the metals are approximately 98% of Ag, 1% of platinum group metal, and 1% of Cu.

The light reflecting film 17 is formed integrally so as to lie across the four inclined surfaces 14 along the circumferential direction of the inclined surfaces 14 (direction along the peripheral edge of the bottom surface 12). The light reflecting film 17 is formed to expose a crossing portion 20 having a tetragonal ring shape in a plan view formed by crossing the bottom surface 12 and inclined surfaces 14 of the Si submount 3, and cover the peripheral edge portion of the recess portion 11 on the top surfaces 13 of the side wall 10. Specifically, the lower end of the light reflecting film 17 is positioned slightly higher than the lower ends of the inclined surfaces 14. It is also possible that the light reflecting film 17 is formed across the peripheral edge portion of the bottom surface 12, the inclined surfaces 14, and the top surfaces 13 of the side wall 10 so as to cover the crossing portion 20.

The anode pad 18 and the cathode pad 19 are formed on portions above the bottom wall 9 of the insulating film 16. The anode pad 18 and the cathode pad 19 are disposed adjacent to each other along the longitudinal direction of the Si submount 3. The anode pad 18 and the cathode pad 19 have tetragonal shapes in a plan view.

An anode bonding layer 21 is formed on the anode pad 18, and a cathode bonding layer 22 is formed on the cathode pad 19. The anode bonding layer 21 and the cathode bonding layer 22 have a double layered structure (Ti/Au) consisting of a Ti layer and an Au layer laminated in order from the bottom surface 12 side. In a plan view, the anode bonding layer 21 has a substantially E shape wider in the longitudinal direction of the Si submount 3 than the anode electrode 7, and the cathode bonding layer 22 has a substantially I shape wider along the longitudinal direction of the Si submount 3 than the cathode electrode 8.

The LED chip 2 is supported from below by the Si submount 3 in a face-down position in which the surface 4 of the LED chip 2 is directed downward by bonding the anode electrode 7 and the anode bonding layer 21 both having a substantially E shape to each other and the cathode electrode 8 and the cathode bonding layer 22 both having a substantially I shape to each other, respectively. Accordingly, an LED element unit 1 having a lamination structure including lamination of the LED chip 2 and the Si submount 3 is configured. In the lamination structure, the anode bonding layer 21 wider than the anode electrode 7 has an anode pulled-out portion 23 pulled out to the opposite side of the cathode bonding layer 22. In addition, the cathode bonding layer 22 wider than the cathode electrode 8 has a cathode pulled-out portion 24 pulled out to the opposite side of the anode bonding layer 21. To these anode pulled-out portion 23 and cathode pulled-out portion 24, bonding wires 25 for supplying electric power to the anode and the cathode of the LED chip 2 are connected, respectively.

The recess portion 11 of the Si submount 3 is filled with a resin phosphor 26 (not illustrated in FIG. 1). The resin phosphor 26 is a substance that changes the wavelength of light emitted from the LED chip 2, and accordingly, light in a color different from the color of light emitted from the LED chip 2 can be extracted from the LED element unit 1. For example, when the LED chip 2 emits blue light (wavelength: approximately 450 nm), the blue light is converted into white light by the resin phosphor 26, and the white light is extracted.

FIG. 3A to FIG. 3J are schematic sectional views showing parts of a manufacturing process of the LED element unit shown in FIG. 2.

Figure 3A:
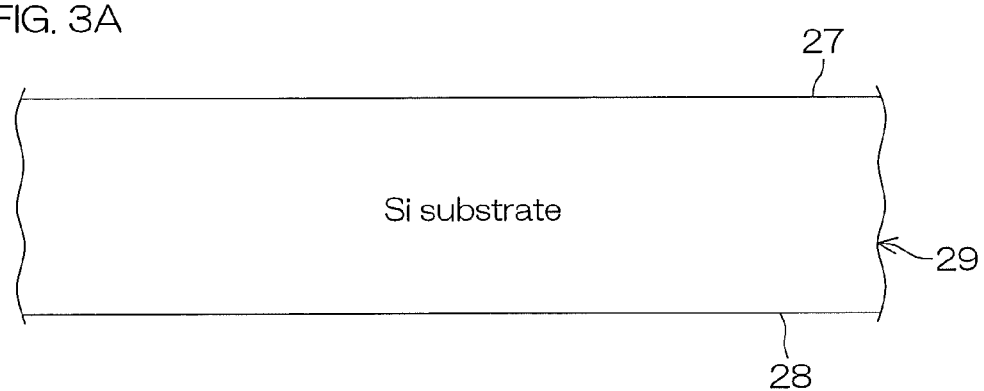
FIG. 3A to FIG. 3J are schematic sectional views showing parts of a manufacturing process of the LED element unit shown in FIG. 2 in order of steps.

To manufacture the LED element unit 1 shown in FIG. 1, for example, first, as shown in FIG. 3A, a wafer-like Si substrate 29 (with a thickness of, for example, 400 μm) having a surface 27 (surface (100)) and a back surface 28 is prepared.

Figure 3B:
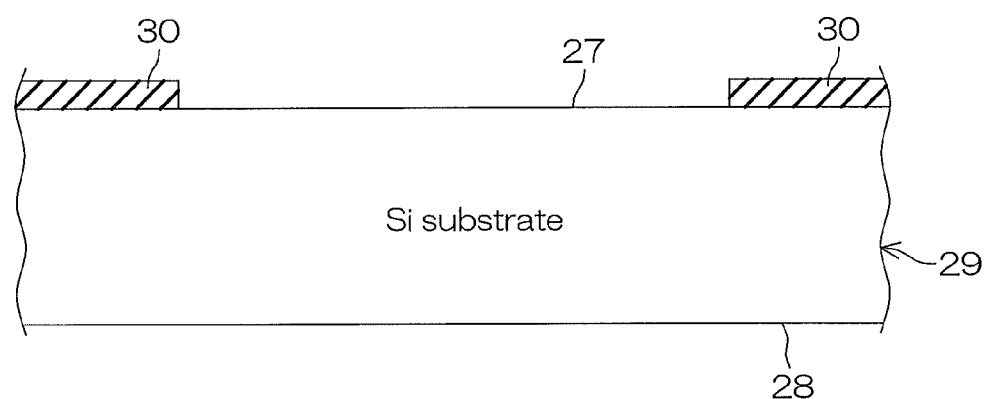

Next, as shown in FIG. 3B, by, for example, a thermal oxidation method, an oxide film 30 (with a thickness of, for example, 1000 nm) is formed as a first mask on the surface 27 of the Si substrate 29. Next, by known photolithography, the oxide film 30 is patterned into a tetragonal ring shape in a plan view. Accordingly, on the surface 27 of the Si substrate 29, the central portion surrounded by the oxide film 30 is exposed.

Figure 3C:
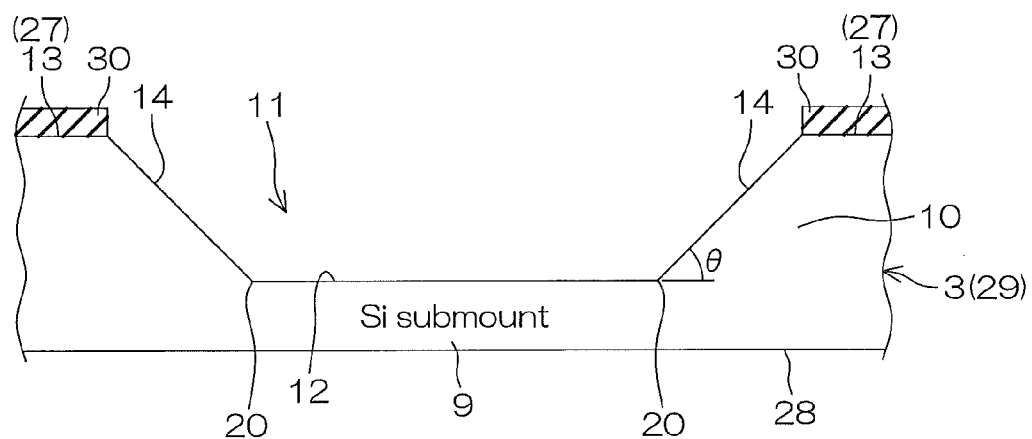

Next, as shown in FIG. 3C, an etchant is supplied onto the surface 27 of the Si substrate 29 (for, for example, approximately 5 hours) via the oxide film 30 that makes the central portion of the Si substrate 29 exposed. As the etchant, for example, a potassium hydroxide (KOH) solution, a tetramethyl ammonium hydroxide (TMAH) solution, or the like is used. By supplying the etchant, the Si substrate 29 is wet-etched (anisotropically etched) from the surface 27 (surface (100)) side. Accordingly, the recess portion 11 is formed on the Si substrate 29, and a vessel-shaped Si submount 3 having inclined surfaces 14 inclined at an angle θ is formed.

Figure 3D:
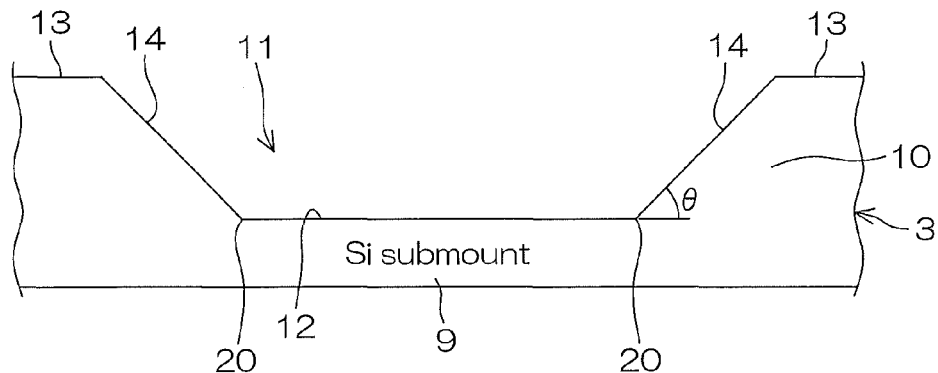

Next, as shown in FIG. 3D, by, for example, LL-BHF (Buffered Hydrogen Fluoride) treatment, the oxide film 30 is removed from the Si submount 3.

Figure 3E:
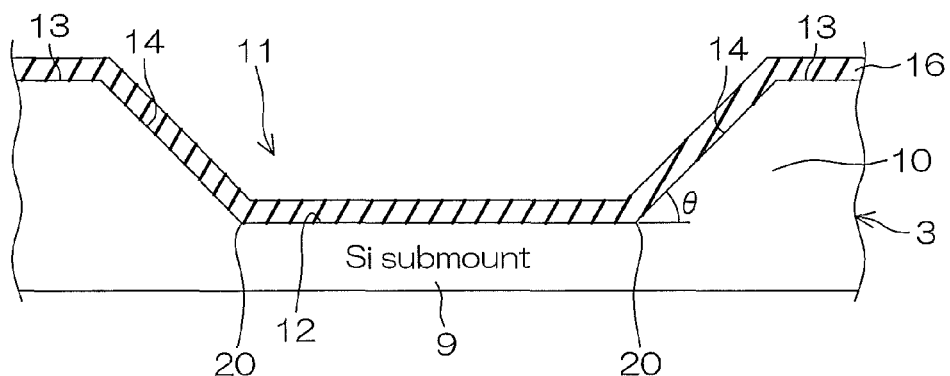

Next, as shown in FIG. 3E, by, for example, a thermal oxidation method, an insulating film 16 is formed on the entire surface of the Si submount 3.

Figure 3F:
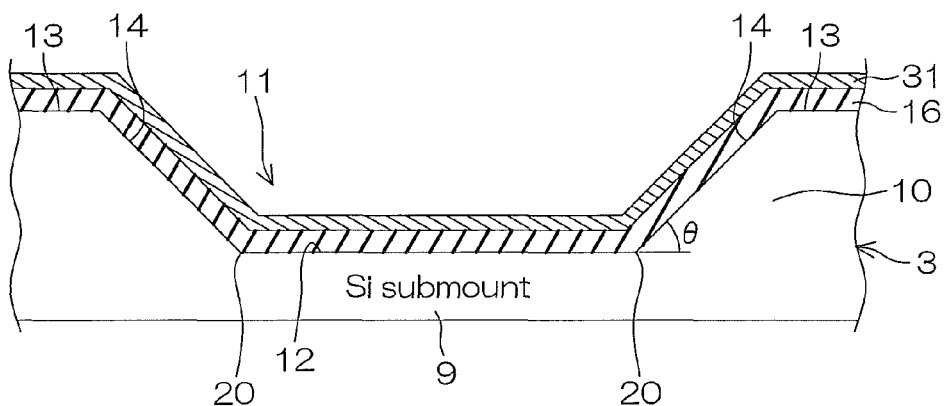

Next, as shown in FIG. 3F, by, for example, a sputtering method, an Al deposition layer 31 as a conductive material capable of reflecting light is formed to cover the entire region of the insulating film 16.

Figure 3G:
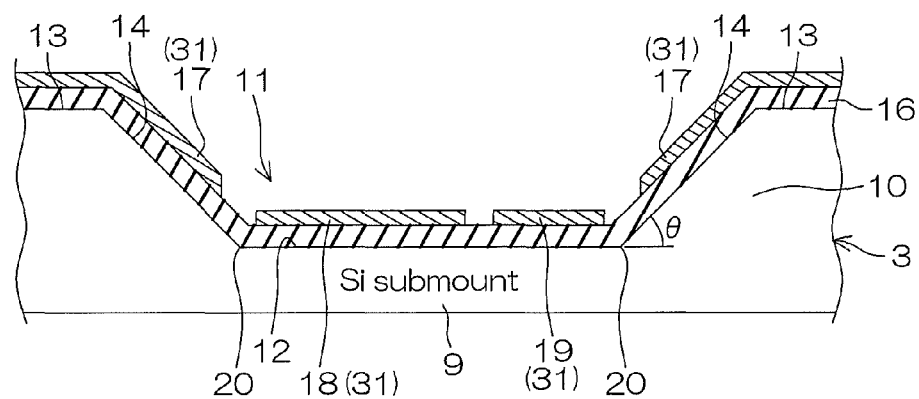

Next, as shown in FIG. 3G, by known photolithography, the Al deposition layer 31 is patterned. Accordingly, a light reflecting film 17, an anode pad 18 as a first pad, and a cathode pad 19 as a second pad that are separated from each other are formed simultaneously.

Figure 3H:
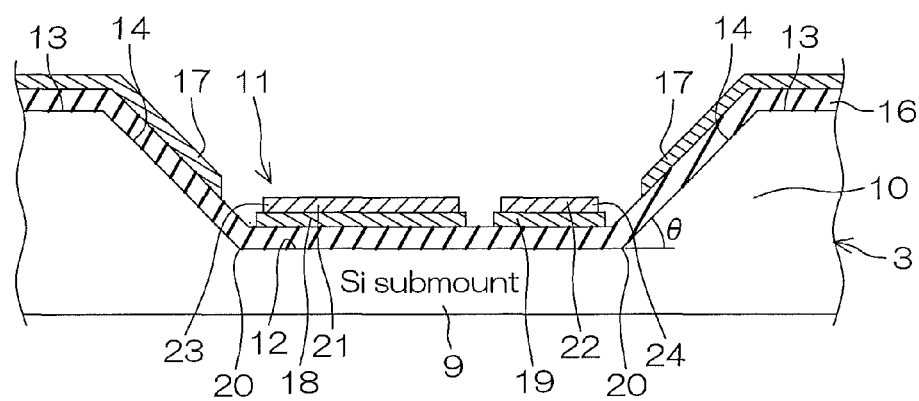
Figure 3:
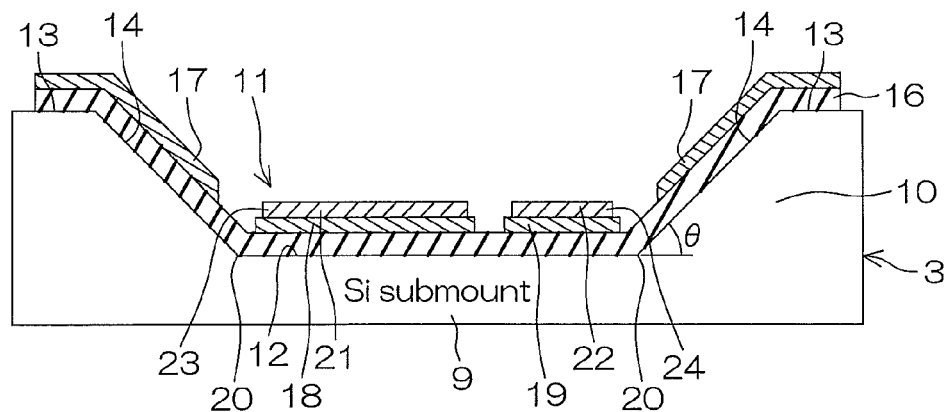

Next, as shown in FIG. 3H, a negative-type photoresist (not illustrated) is applied onto the entire surface of the Si submount 3, and the negative-type photoresist is patterned to have openings in regions in which the anode bonding layer 21 and the cathode bonding layer 22 should be formed. Then, by, for example, a sputtering method, a Ti layer and an Au layer are deposited in order on the negative-type photoresist. Thereafter, unnecessary portions of the Ti layer and the Au layer are lifted off together with the negative-type photoresist. Accordingly, the anode bonding layer 21 and the cathode bonding layer 22 are formed.

Next, as shown in FIG. 3I, portions on dicing lines set on the top surfaces 13 of the Si submount 3 of the light reflecting film 17 and the insulating film 16 are selectively removed. Thereafter, the Si submount 3 is cut along the dicing lines. Accordingly, the wafer is divided into Si submounts 3.

Figure 3J:
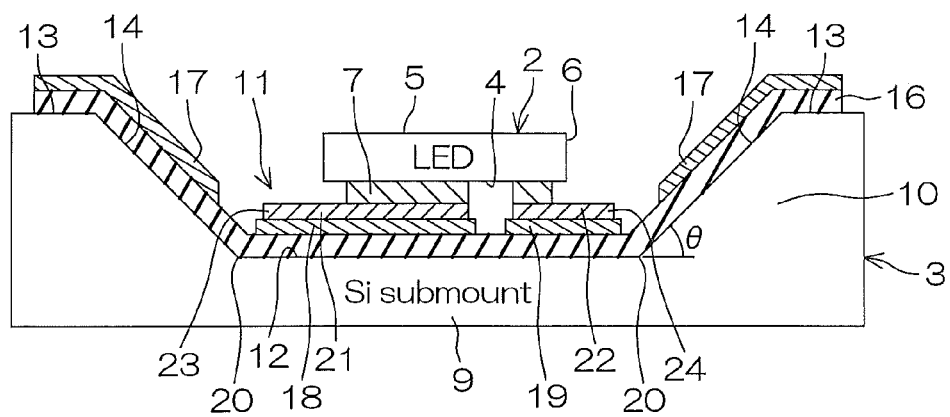

Next, as shown in FIG. 3J, the anode electrode 7 and the cathode electrode 8 of the LED chip 2 are bonded to the anode bonding layer 21 and the cathode bonding layer 22 of each divided Si submount 3 on a one-to-one basis. Thereafter, the recess portion 11 of the Si submount 3 is filled with a resin phosphor 26.

Through the above-described steps, the LED element unit 1 shown in FIG. 1 is obtained.

As described above, in the LED element unit 1, on the recess portion 11 of the Si submount 3, inclined surfaces 14 which face the side surfaces 6 of the LED chip 2 and on which the light reflecting film 17 is formed are formed. By the inclined surfaces 14 (light reflecting film 17), lights exiting from the side surfaces 6 of the LED chip 2 can be reflected in the same direction as the emitting direction of light from the light extracting surface (the back surface 5 of the LED chip 2). As a result, the reflected lights can be extracted as light contributing to the brightness of the LED chip 2.

Further, the inclined surfaces 14 are formed on the side wall 10 of the Si submount 3, so that the distance D between the side surface 6 of the LED chip 2 and the inclined surface 14 can be designed according to the size of the LED chip 2. Therefore, by setting the distance D to an appropriate distance, the lights can be reflected by the inclined surfaces 14 (light reflecting film 17) before lights exiting from the side surfaces 6 of the LED chip 2 attenuate. As a result, a loss until the reflected lights are extracted can be reduced, and the lights from the side surfaces 6 of the LED chip 2 can be efficiently extracted. Accordingly, the brightness of the LED chip 2 can be improved.

The inclination angle θ of the inclined surfaces 14 can be easily formed by wet-etching the Si substrate 29 whose principal surface (surface 27) is the surface (100) from the principal surface side and anisotropically etching the Si crystal (the step shown in FIG. 3C).

The light reflecting film 17 is formed along the circumferential direction of the inclined surfaces 14 surrounding the LED chip 2. Therefore, lights exiting from the side surfaces 6 of the LED chip 2 can be uniformly extracted. As a result, the brightness of the LED chip 2 can be further improved.

The light reflecting film 17 is exposed inside the recess portion 11, so that lights from the side surfaces 6 of the LED chip 2 can be directly irradiated onto the light reflecting film 17. Therefore, the light reflectance can be improved.

The anode pad 18 and the cathode pad 19 are made of the same material as that of the light reflecting film 17, so that in the manufacturing process of the LED element unit 1, by utilizing a known semiconductor device manufacturing technology such as photolithography, the light reflecting film 17 and the anode pad 18 and the cathode pad 19 can be easily manufactured simultaneously (the step shown in FIG. 3G).

In the LED element unit 1, as shown in FIG. 2, the recess portion 11 is filled with the resin phosphor 26, and even when slight light attenuation due to the resin phosphor 26 is a concern, by the reflecting effect of the light reflecting film 17 formed on the inclined surfaces 14 of the Si submount 3, a decrease in the light extraction amount can be reduced.

The LED element unit 1 according to the first preferred embodiment can be utilized for various LED packages.

Figure 4:
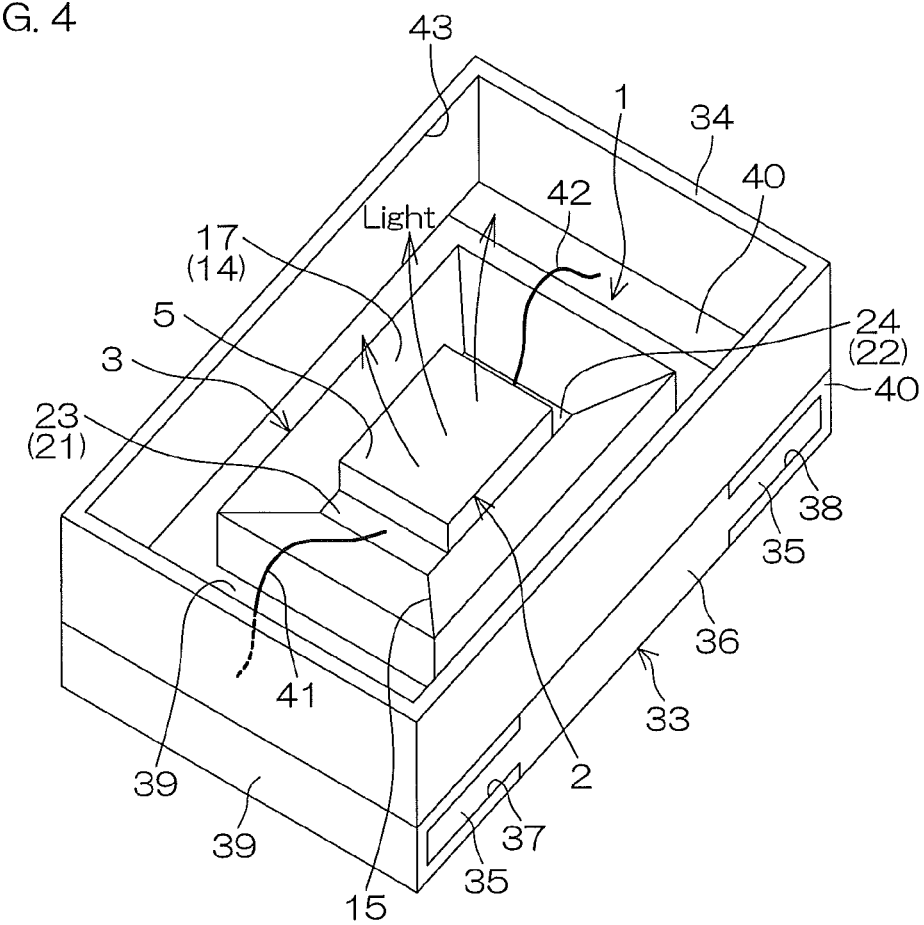
FIG. 4 is a schematic perspective view of an LED package with the LED element unit shown in FIG. 1.

FIG. 4 is a schematic perspective view of an LED package with the LED element unit shown in FIG. 1.

The LED package 32 is used for, for example, signals, electronic billboards, backlights of liquid crystal displays, various illuminations such as lamps of automobiles and bikes, and light sources for exposure of electrophotographic printers, etc.

The LED package 32 includes a base substrate 33 and a resin case 34 attached onto the base substrate 33.

The base substrate 33 is formed to have a rectangular plate shape as a whole by fitting metal-made anode terminal 39 and cathode terminal 40 on which concavities 37 and 38 are formed corresponding to convexities 35 of an insulating substrate 36 having the convexities 35 on the end portions. The anode terminal 39 and the cathode terminal 40 form end portions in the longitudinal direction of the base substrate 33, respectively.

A resin case 34 is formed like a wall forming a tetragonal ring along the peripheral edge of the base substrate 33 so as to surround the central portion of the base substrate 33.

To the central portion of the base substrate 33 surrounded by the resin case 34, the above-described LED element unit 1 is mounted. An anode pulled-out portion 23 of the LED element unit 1 and the anode terminal 39 are connected by a bonding wire 41, and a cathode pulled-out portion 24 of the LED element unit 1 and the cathode terminal 40 are connected by a bonding wire 42.

Light generated by the LED element unit 1 is emitted from the open surface 43 (the surface opposite to the base substrate 33) of the resin package.

In the LED package 32, the above-described LED element unit 1 is used, and the light extraction efficiency from the LED chip 2 is high, so that a high-brightness LED package 32 can be provided.

The LED element unit 1 according to the first preferred embodiment is arranged to reflect lights from the side surfaces 6 of the LED chip 2, and does not require a resin package surrounding the LED element unit 1 (for example, the resin package shown in FIG. 4 or the like), so that the LED element unit 1 can be directly utilized for various LED illuminations.

Figure 5:
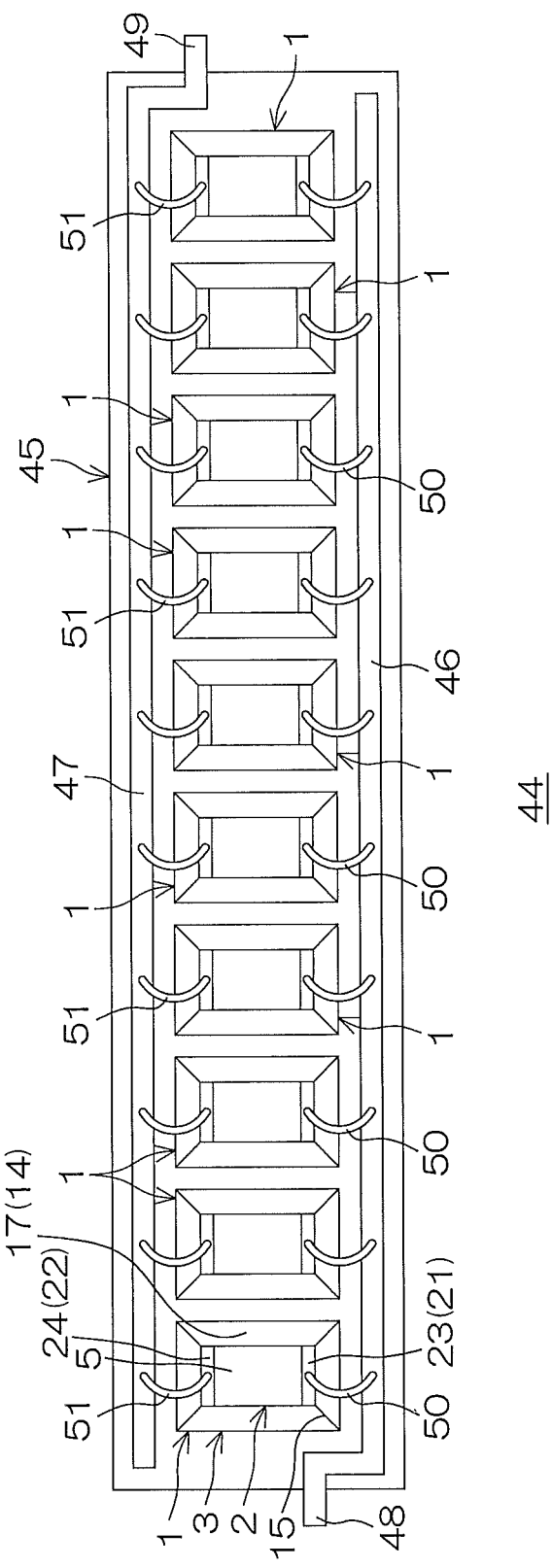
FIG. 5 is a schematic perspective view of an LED bar light with the LED element unit shown in FIG. 1.

FIG. 5 is a schematic perspective view of an LED bar light with the LED element unit shown in FIG. 1.

The LED bar light 44 as an illuminating device includes a long and thin support bar 45, and an anode wiring 46 and a cathode wiring 47 formed parallel to each other along the longitudinal direction of the support bar 45.

The anode wiring 46 is exposed as an anode terminal 48 from one end of the support bar 45. The cathode wiring 47 is exposed as a cathode terminal 49 from the other end (the end portion on the side opposite to the anode terminal 48) of the support bar 45.

In the region between the anode wiring 46 and the cathode wiring 47, a plurality (10 in FIG. 5) of LED element units 1 are aligned along the longitudinal direction of the support bar 45. Each LED element unit 1 is installed so that its anode side faces the anode wiring 46 and its cathode side faces the cathode wiring 47. The anode pulled-out portion 23 of the LED element unit 1 and the anode wiring 46 are connected by a bonding wire 50, and the cathode pulled-out portion 24 of the LED element unit 1 and the cathode wiring 47 are connected by a bonding wire 51.

In the LED bar light 44, the above-described LED element units 1 are used, and the light extraction efficiency from LED chips 2 is high, so that a high-brightness LED illumination can be provided.

Second Preferred Embodiment

Figure 6:
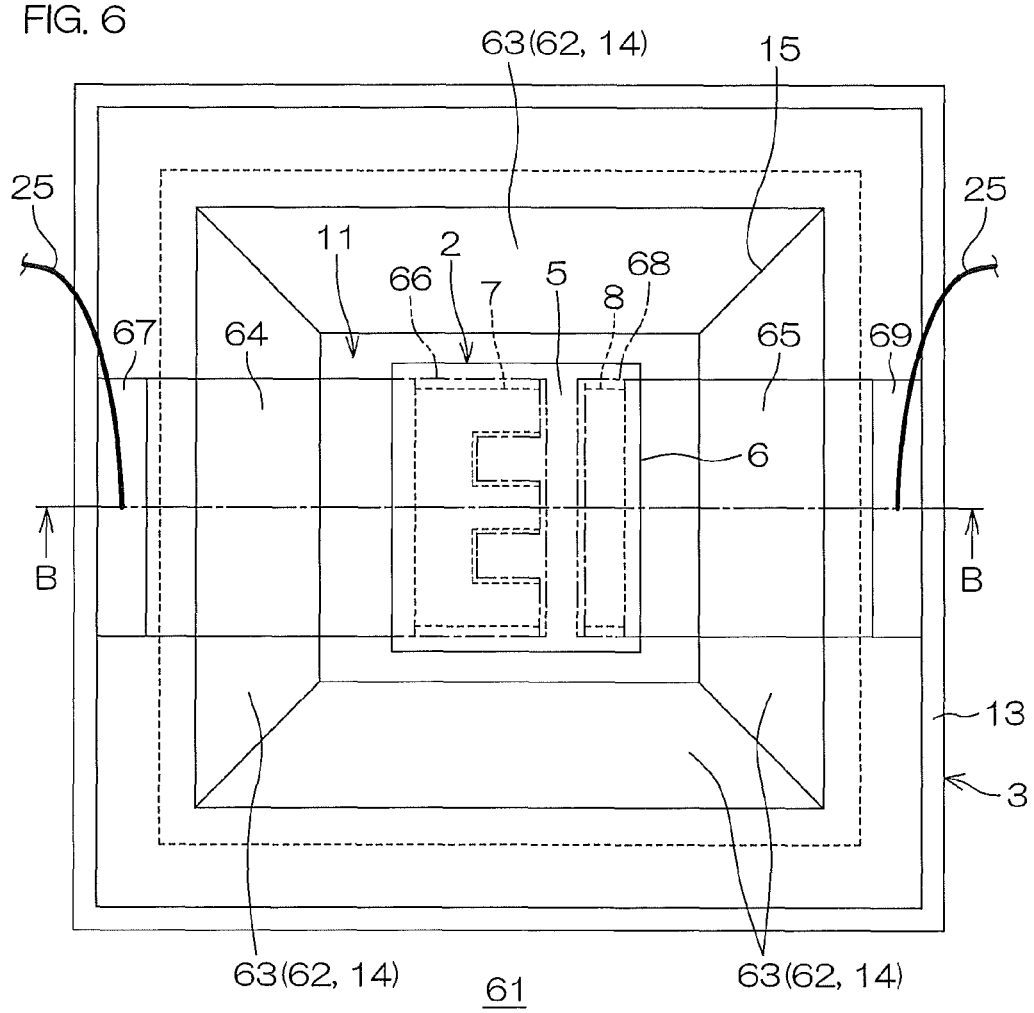
FIG. 6 is a schematic plan view of an LED element unit according to a second preferred embodiment of the present invention.
Figure 7:
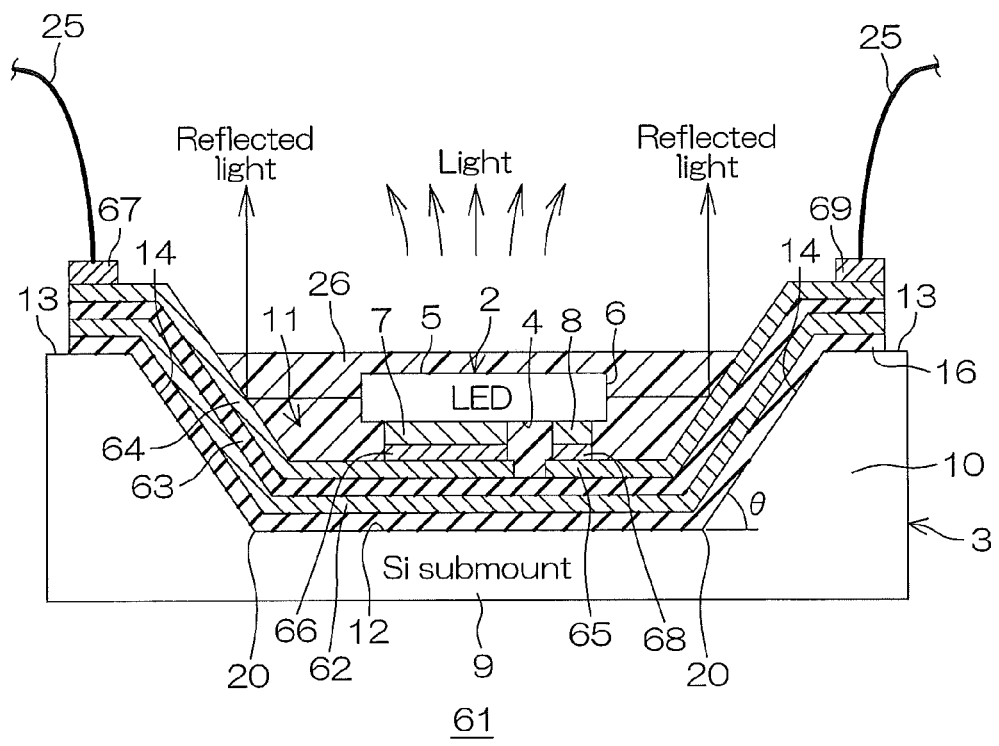
FIG. 7 is a sectional view of the LED element unit shown in FIG. 6, illustrating a section taken along line B-B in FIG. 6.

FIG. 6 is a schematic plan view of an LED element unit according to a second preferred embodiment of the present invention. FIG. 7 is a sectional view of the LED element unit shown in FIG. 6, illustrating a section taken along line B-B in FIG. 6. In FIG. 6 and FIG. 7, portions corresponding to the portions shown in FIG. 1 and FIG. 2 are provided with the same reference symbols as those provided for the portions. Hereinafter, in the structure shown in FIG. 6 and FIG. 7, only differences from the structure shown in FIG. 1 and FIG. 2 are described, and description of the portions provided with the same reference symbols is omitted.

In the LED element unit 61 according to the second preferred embodiment, a light reflecting film 62 is formed integrally on the insulating film 16. The light reflecting film 62 is made of the same material (for example, Al) as that of the light reflecting film 17 described above. The light reflecting film 62 is formed across the bottom surface 12, the inclined surfaces 14, and the top surfaces 13 of the side wall 10 of the Si submount 3 so as to cover the entire region of the insulating film 16 integrally.

On the light reflecting film 62, a second insulating film 63 (oxide film) made of $SiO_2$ is formed. The second insulating film 63 is formed across the bottom surface 12, the inclined surfaces 14, and the top surfaces 13 of the side wall 10 of the Si submount 3 so as to cover the entire region of the light reflecting film 62 integrally.

On the second insulating film 63, an anode wiring 64 and a cathode wiring 65 are formed. The anode wiring 64 and the cathode wiring 65 are made of a conductive material capable of reflecting light, for example, the same material as that of the light reflecting film 62.

The anode wiring 64 is pulled out along the inclined surface 14 from the bottom surface 12 to one of the top surfaces 13 forming a pair of short sides of the side wall 10 along the longitudinal direction of the Si submount 3, and is formed across the bottom surface 12, the inclined surface 14, and the top surface 13.

The cathode wiring 65 is pulled out along the inclined surface 14 from the bottom surface 12 to the other of the top surfaces 13 forming the pair of short sides of the side wall 10 along the longitudinal direction of the Si submount 3, and formed across the bottom surface 12, the inclined surface 14, and the top surface 13.

Specifically, the anode wiring 64 and the cathode wiring 65 are aligned linearly as a whole along the longitudinal direction of the Si submount 3, and separated from each other at the portion above the bottom wall 9 of the second insulating film 63.

On the portion above the bottom surface 12 of the anode wiring 64, an anode bonding layer 66 is formed, and on the portion above the top surface 13, an anode terminal layer 67 is formed. The anode bonding layer 66 and the anode terminal layer 67 have a double-layered structure (Ti/Au) including a Ti layer and an Au layer laminated in order from the bottom surface 12 side. In a plan view, the anode bonding layer 66 has a substantially E shape wider along the longitudinal direction of the Si submount 3 than the anode electrode 7, and the anode terminal layer 67 has, for example, a substantially I shape.

On the portion above the bottom surface 12 of the cathode wiring 65, a cathode bonding layer 68 is formed, and on the portion above the top surface 13, a cathode terminal layer 69 is formed. The cathode bonding layer 68 and the cathode terminal layer 69 have a double-layered structure (Ti/Au) including a Ti layer and an Au layer laminated in order from the bottom surface 12 side. In a plan view, the cathode bonding layer 68 has, for example, a substantially I shape wider along the longitudinal direction of the Si submount 3 than the cathode electrode 8, and the cathode terminal layer 69 has, for example, a substantially I shape.

The LED chip 2 is supported from below by the Si submount 3 in a face-down position in which the surface 4 of the LED chip 2 is directed downward by bonding the anode electrode 7 and the anode bonding layer 66 both having the substantially E shape to each other and bonding the cathode electrode 8 and the cathode bonding layer 68 both having the substantially I shape to each other. Accordingly, the LED element unit 61 having a lamination structure including the LED chip 2 and the Si submount 3 is configured. To the anode terminal layer 67 and the cathode terminal layer 69, bonding wires 25 for supplying electric power to the anode and cathode of the LED chip 2 are connected, respectively.

FIG. 8A to FIG. 8E are schematic sectional views showing parts of a manufacturing process of the LED element unit shown in FIG. 7.

To manufacture the LED element unit 61 shown in FIG. 7, for example, by performing the steps shown in FIG. 3A to FIG. 3F, the Si submount 3 on which the recess portion 11 is formed is formed, and on the Si submount 3, the insulating film 16 and the Al deposition layer 31 (light reflecting film 62) are formed in order.

Next, as shown in FIG. 8A, by, for example, a CVD (Chemical Vapor Deposition) method, a second insulating film 63 is formed to cover the entire region of the light reflecting film 62.

Next, as shown in FIG. 8B, a negative-type photoresist (not illustrated) is applied onto the entire surface of the Si submount 3, and the negative-type photoresist is patterned to have openings in regions in which the anode wiring 64 and the cathode wiring 65 should be formed. Then, by, for example, a sputtering method, an Al layer is deposited on the negative-type photoresist. Thereafter, unnecessary portions of the Al layer are lifted off together with the negative-type photoresist. Accordingly, the anode wiring 64 as a first wiring and the cathode wiring 65 as a second wiring are formed simultaneously.

Next, as shown in FIG. 8C, by the same method as the lift-off method shown in FIG. 8B, the anode bonding layer 66, the anode terminal layer 67, the cathode bonding layer 68, and the cathode terminal layer 69 are formed simultaneously.

Figure 8D:
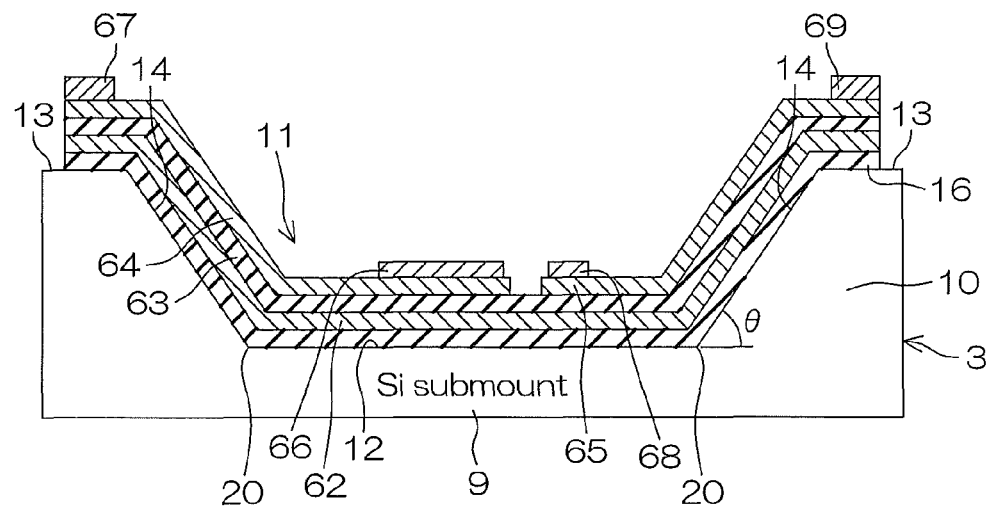

Next, as shown in FIG. 8D, portions on dicing lines set on the top surfaces 13 of the Si submount 3 of the anode terminal layer 67, the cathode terminal layer 69, the anode wiring 64, the cathode wiring 65, the second insulating film 63, the light reflecting film 62, and the insulating film 16 are selectively removed. Thereafter, the Si submount 3 is cut along the dicing lines. Accordingly, the wafer is divided into Si submounts 3.

Figure 8E:
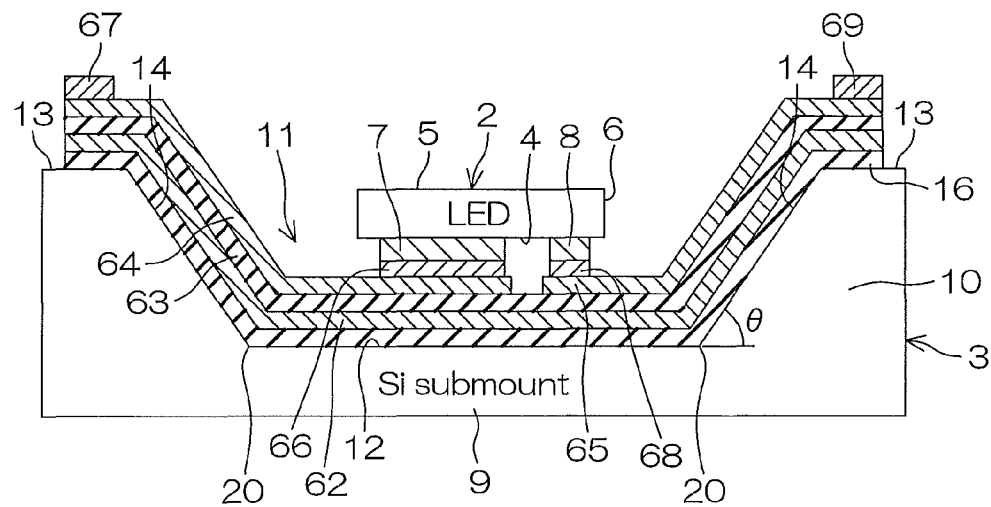

Next, as shown in FIG. 8E, to the anode bonding layer 66 and the cathode bonding layer 68 of each divided Si submount 3, the anode electrode 7 and the cathode electrode 8 of the LED chip 2 are bonded on a one-to-one basis. Thereafter, the recess portion 11 of the Si submount 3 is filled with the resin phosphor 26.

Through the steps described above, the LED element unit 61 shown in FIG. 7 is obtained.

By the LED element unit 61 according to the second preferred embodiment, the same operations and effects as those of the LED element unit 1 according to the first preferred embodiment are also obtained.

Further, in the LED element unit 61, the anode wiring 64 and the cathode wiring 65 are laid along the inclined surfaces 14 by using a conductive material capable of reflecting light, and pulled out to the top surfaces 13 of the side wall 10 of the Si submount 3. Accordingly, bonding wires 25 that supply electric power to the anode and the cathode of the LED chip 2 can be connected to the top surfaces 13 (the anode terminal layer 67 and the cathode terminal layer 69) of the Si submount 3. Therefore, lights from the side surfaces 6 of the LED chip 2 can be prevented from colliding with obstacles such as wires before reaching the inclined surfaces 14 (the light reflecting film 62, the anode wiring 64, and the cathode wiring 65). As a result, a loss to be caused by collision with obstacles can be reduced, so that the lights from the side surfaces 6 of the LED chip 2 can be efficiently extracted.

The anode wiring 64 and the cathode wiring 65 are made of a conductive material capable of reflecting light, so that the lights irradiated onto these wirings can be reflected in the same direction as the emitting direction of the light from the light extracting surface. In addition, the anode wiring 64 and the cathode wiring 65 are formed along the longitudinal direction of the Si submount. Therefore, while lights from the side surfaces 6 of the LED chip 2 which cross the longitudinal direction are reflected by the anode wiring 64 and the cathode wiring 65, lights from the side surfaces 6 of the LED chip 2 along the longitudinal direction can be allowed to pass through the second insulating film 63 and reflected by the light reflecting film 62. Therefore, the amounts of lights to be reflected by the inclined surfaces 14 opposed to each other can be made substantially equal to each other. As a result, polarization of light to be extracted can be reduced.

The LED element unit 61 according to the second preferred embodiment can also be utilized for various LED packages and various LED illuminations like the LED element unit 1 according to the first preferred embodiment.

Third Preferred Embodiment

Figure 9:
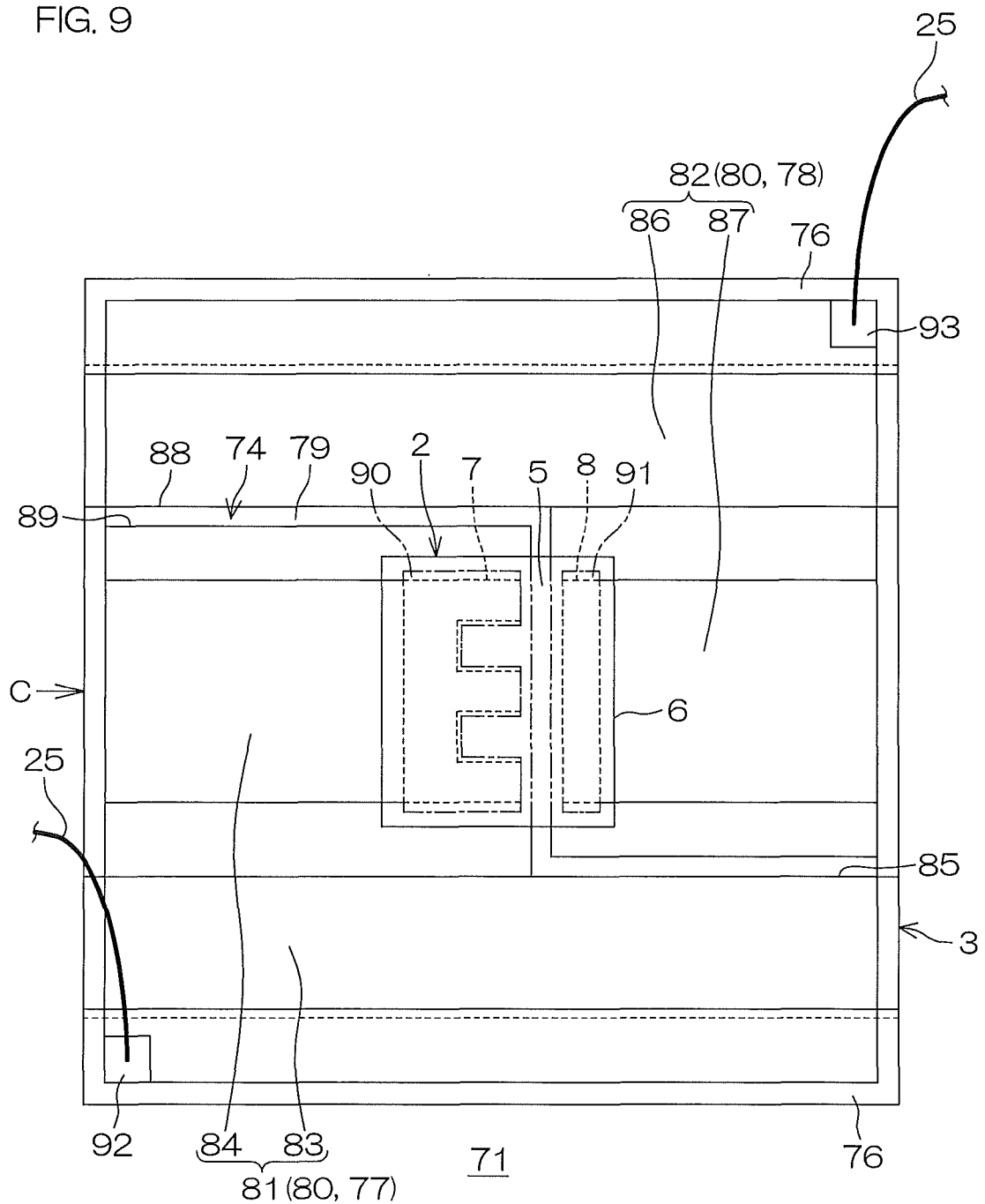
FIG. 9 is a schematic plan view of an LED element unit according to a third preferred embodiment of the present invention.
Figure 10:
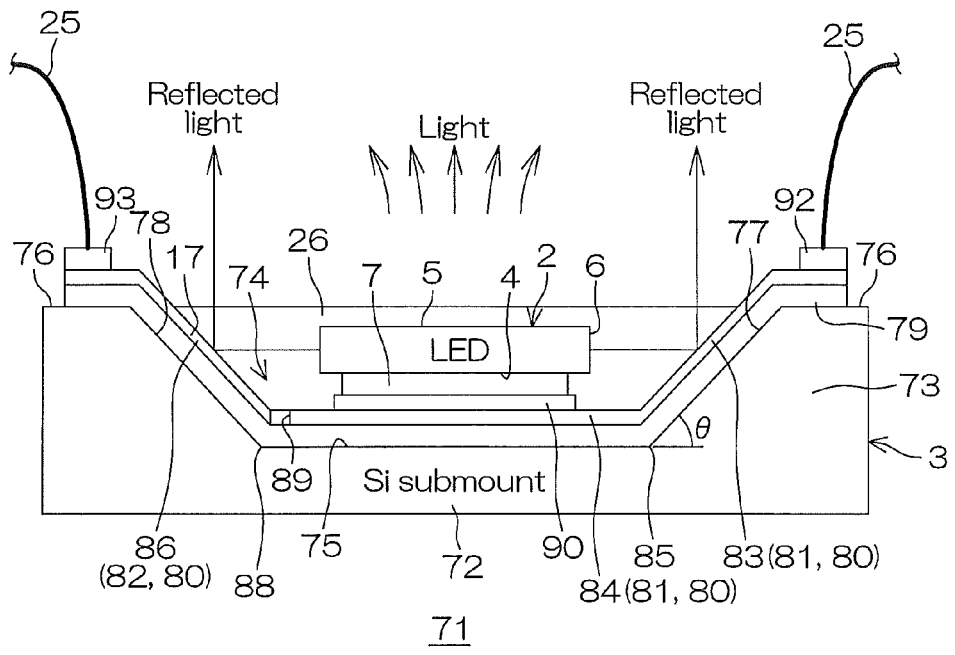
FIG. 10 is a side view of the LED element unit shown in FIG. 9, illustrating a side surface when the LED element unit is observed from the direction C in FIG. 9.

FIG. 9 is a schematic plan view of an LED element unit according to a third preferred embodiment of the present invention. FIG. 10 is a side view of the LED element unit shown in FIG. 9, illustrating a side surface when the LED element unit is observed from the direction C in FIG. 9. In FIG. 9 and FIG. 10, portions corresponding to the portions shown in FIG. 1 and FIG. 2 are provided with the same reference symbols as those provided for the portions. Hereinafter, in the structure shown in FIG. 9 and FIG. 10, only differences from the structure shown in FIG. 1 and FIG. 2 are described, and description of the portions provided with the same reference symbols is omitted.

In the LED element unit 71 according to the third preferred embodiment, the Si submount 3 includes a bottom wall 72 and side walls 73 opposed to each other along the width direction of the Si submount 3 across the bottom wall 72, and is formed to have a half-pipe shape concave in a side view by forming a recess portion 74 on the portion surrounded by the bottom wall 72 and the side walls 73. Specifically, the recess portion 74 is defined by the bottom wall 72 and the side walls 73 of the Si submount 3. The surface facing the recess portion 74 of the bottom wall 72 (the bottom surface 75 of the Si submount 3) is the surface (100).

The surfaces facing the recess portion 74 of the side walls 73 of the Si submount 3 are formed of two planes each of which shares one side with each of the two top surfaces 76 forming a pair of sides of the side walls 73 in a plan view. These two planes are a first inclined surface 77 and a second inclined surface 78 (tapering surfaces) the distance between which narrows toward the bottom wall 72.

The inclined surfaces 77 and 78 are inclined at an angle θ with respect to the bottom surface 75 of the Si submount 3. The angle θ is, for example, 30 to 80 degrees, preferably 40 to 70 degrees, more preferably 45 to 65 degrees, particularly preferably 50 to 60 degrees, and most preferably 53 to 57 degrees.

On the surface of the Si submount 3, an insulating film 79 (oxide film) made of $SiO_2$ is formed. The insulating film 79 is formed across the bottom surface 75, the first and second inclined surfaces 77 and 78, and the top surfaces 76 of the side walls 73 so as to cover the entire regions of the bottom surface 75 and the first and second inclined surfaces 77 and 78 of the Si submount 3 integrally.

On the insulating film 79, a light reflecting film 80 is formed. The light reflecting film 80 is made of the same material (for example, Al) as that of the light reflecting film 17 described above.

The light reflecting film 80 is formed to be exposed inside the recess portion 74 of the Si submount, and includes an anode side reflecting film 81 and a cathode side reflecting film 82 separated from each other.

The anode side reflecting film 81 includes a first reflecting portion 83 and an anode connecting portion 84 integrally.

From one end to the other end in the longitudinal direction of the Si submount, the first reflecting portion 83 is formed across a first crossing portion 85 formed by crossing the bottom surface 75 and the first inclined surface 77 of the Si submount, the first inclined surface 77, and the top surface 76 of the side wall 73.

The anode connecting portion 84 is a pulled-out portion pulled out along the bottom surface 75 from one end portion in the longitudinal direction of the Si submount of the first reflecting portion 83 to the second inclined surface 78 side.

The cathode side reflecting film 82 includes a second reflecting portion 86 and a cathode connecting portion 87 integrally.

From one end to the other end in the longitudinal direction of the Si submount, the second reflecting portion 86 is formed across a second crossing portion 88 formed by crossing the bottom surface 75 and the second inclined surface 78 of the Si submount, the second inclined surface 78, and the top surface 76 of the side wall 73.

The cathode connecting portion 87 is a pulled-out portion pulled out from the other end portion in the longitudinal direction of the Si submount of the second reflecting portion 86 (the end portion opposite to the anode connecting portion 84) onto the bottom surface 75 toward the first inclined surface 77 side. Accordingly, the anode connecting portion 84 and the cathode connecting portion 87 are disposed adjacent to each other at a distance from each other along the longitudinal direction (axial direction) of the half-pipe-shaped Si submount, and in the portion on the bottom surface 75 of the Si submount 3, a cranked trench 89 defined by the anode side reflecting film 81 and the cathode side reflecting film 82 is formed.

On the anode connecting portion 84, an anode bonding layer 90 is formed, and on the cathode connecting portion 87, a cathode bonding layer 91 is formed. The anode bonding layer 90 and the cathode bonding layer 91 have a double-layered structure (Ti/Au) including a Ti layer and an Au layer laminated in order from the bottom surface 75 side. In a plan view, the anode bonding layer 90 has, for example, a substantially E shape wider along the longitudinal direction of the Si submount 3 than the anode electrode 7, and the cathode bonding layer 91 has a substantially I shape wider along the longitudinal direction of the Si submount 3 than the cathode electrode 8.

On the portion above the top surface 76 of the first reflecting portion 83, an anode terminal layer 92 is formed. The anode terminal layer 92 is made of the same material as that of the anode bonding layer 90. The anode terminal layer 92 is disposed at the end portion on the anode connecting portion 84 side with respect to the center in the longitudinal direction of the Si substrate 96. On the other hand, on the portion above the top surface 76 of the second reflecting portion 86, a cathode terminal layer 93 is formed. The cathode terminal layer 93 is made of the same material as that of the cathode bonding layer 91. The cathode terminal layer 93 is disposed at the end portion on the cathode connecting portion 87 side with respect to the center in the longitudinal direction of the Si substrate 96. Specifically, the anode terminal layer 92 and the cathode terminal layer 93 are disposed diagonally to each other in a plan view of the Si submount.

The LED chip 2 is supported from below by the Si submount 3 in a face-down position in which the surface 4 of the LED chip 2 is directed downward by bonding the anode electrode 7 and the anode bonding layer 90 both having a substantially E shape to each other and bonding the cathode electrode 8 and the cathode bonding layer 91 both having a substantially I shape to each other. Accordingly, the LED element unit 71 having a lamination structure including the LED chip 2 and the Si submount 3 is configured. To the anode terminal layer 92 and the cathode terminal layer 93, bonding wires 25 for supplying electric power to the anode and the cathode of the LED chip 2 are connected, respectively.

FIG. 11A to FIG. 11J are schematic sectional views showing parts of a manufacturing process of the LED element unit shown in FIG. 10.

Figure 11A:
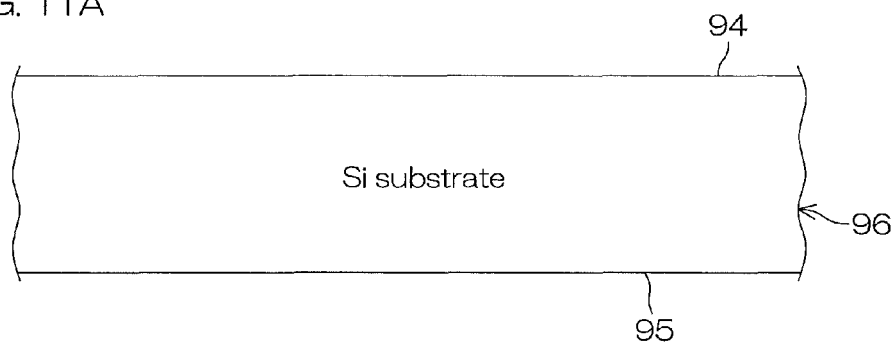
FIG. 11A to FIG. 11J are schematic sectional views showing parts of a manufacturing process of the LED element unit shown in FIG. 10 in order of steps.

To manufacture the LED element unit 71 shown in FIG. 10, for example, first, as shown in FIG. 11A, a wafer-like Si substrate 96 (with a thickness of, for example, 400 μm) having a surface 94 (surface (100)) and a back surface 95 is prepared.

Figure 11B:
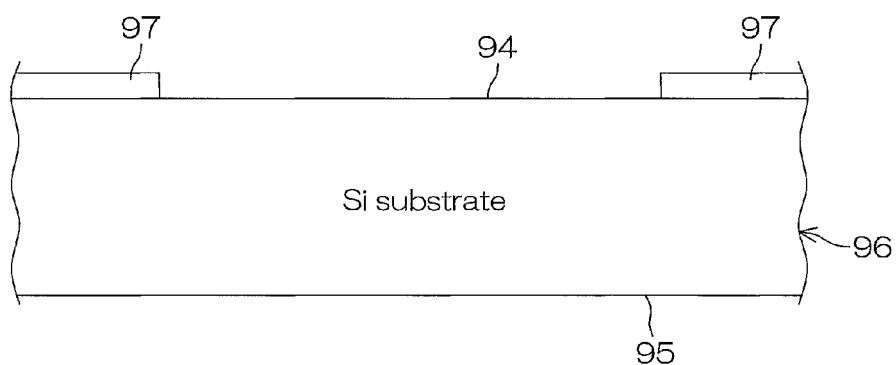

Next, as shown in FIG. 11B, by, for example, a thermal oxidation method, an oxide film 97 (with a thickness of, for example, 1000 nm) as a second mask is formed on the surface 94 of the Si substrate 96. Next, by known photolithography, the oxide film 97 is patterned to be parallel and straight in a plan view. Accordingly, the central portion sandwiched by the pair of oxidation films 97 on the surface 94 of the Si substrate 96 is exposed.

Figure 11C:
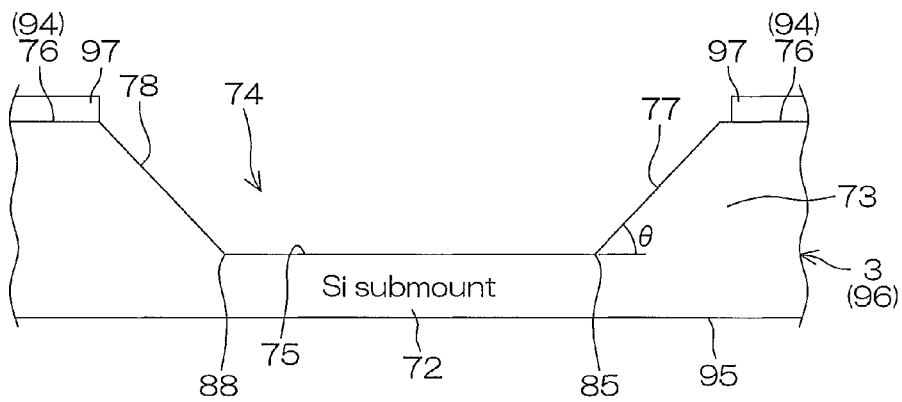

Next, as shown in FIG. 11C, an etchant is supplied (for, for example, approximately 5 hours) onto the surface 94 of the Si substrate 96 via the oxide film 97 that makes the central portion of the Si substrate 96 exposed. As the etchant, for example, a potassium hydroxide (KOH) solution, a tetramethyl ammonium hydroxide (TMAH) solution, or the like is used. By supplying the etchant, the Si substrate 96 is wet-etched (anisotropically etched) from the surface 94 (surface (100)) side. Accordingly, the recess portion 74 is formed on the Si substrate 96, and the half-pipe-shaped Si submount 3 having the first inclined surface 77 and the second inclined surface 78 inclined at the angle θ is formed.

Figure 11D:
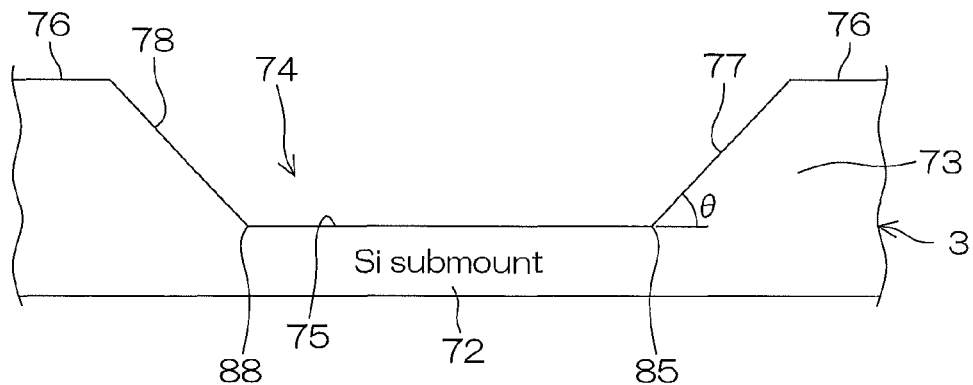

Next, as shown in FIG. 11D, by, for example, LL-BHF (Buffered Hydrogen Fluoride) treatment, the oxide film 97 is removed from the Si submount 3.

Figure 11E:
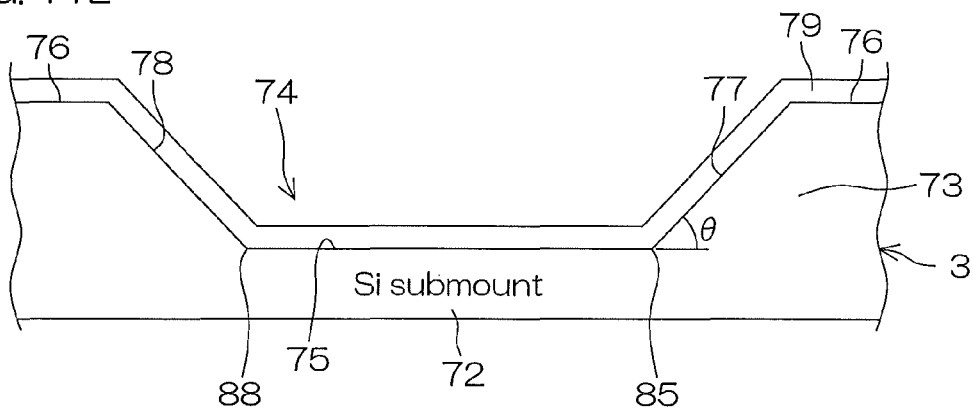

Next, as shown in FIG. 11E, by, for example, a thermal oxidation method, the insulating film 79 is formed on the entire surface of the Si submount 3.

Figure 11F:
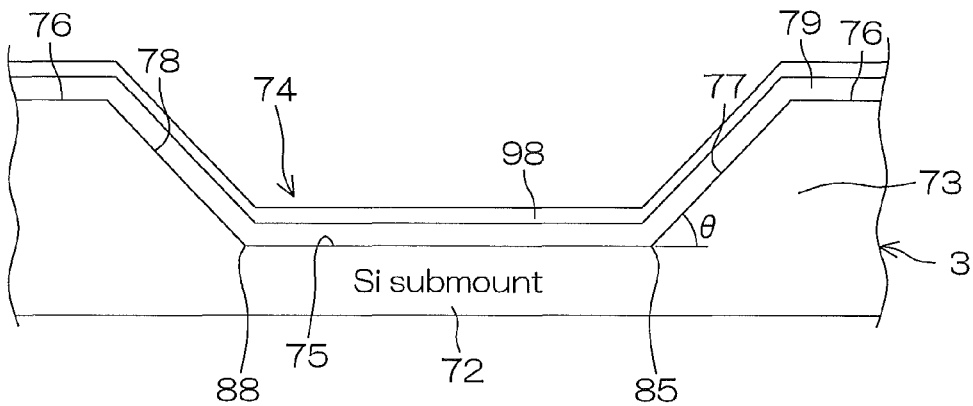

Next, as shown in FIG. 11F, by, for example, a sputtering method, an Al deposition layer 98 as a conductive material capable of reflecting light is formed to cover the entire region of the insulating film 79.

Figure 11G:
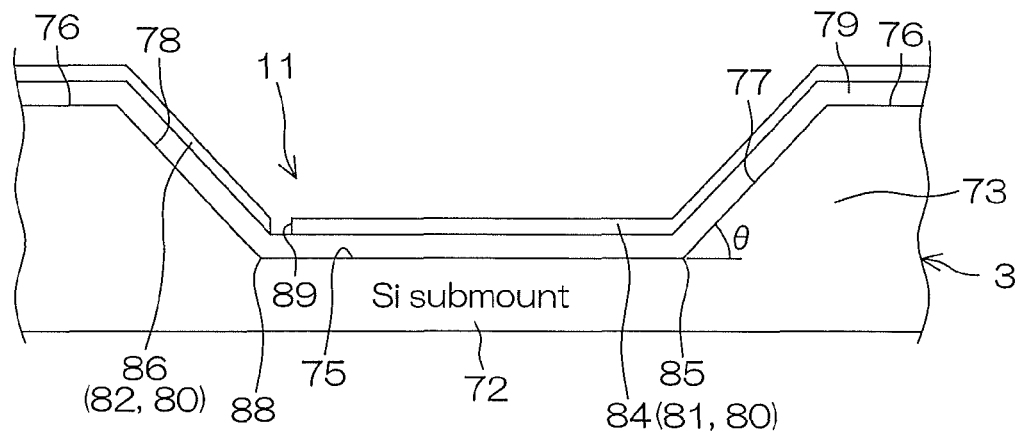

Next, as shown in FIG. 11G, by known photolithography, the Al deposition layer 98 is patterned. Accordingly, the anode side reflecting film 81 as a first reflecting film and the cathode side reflecting film 82 as a second reflecting film that are separated from each other are formed simultaneously.

Figure 11H:
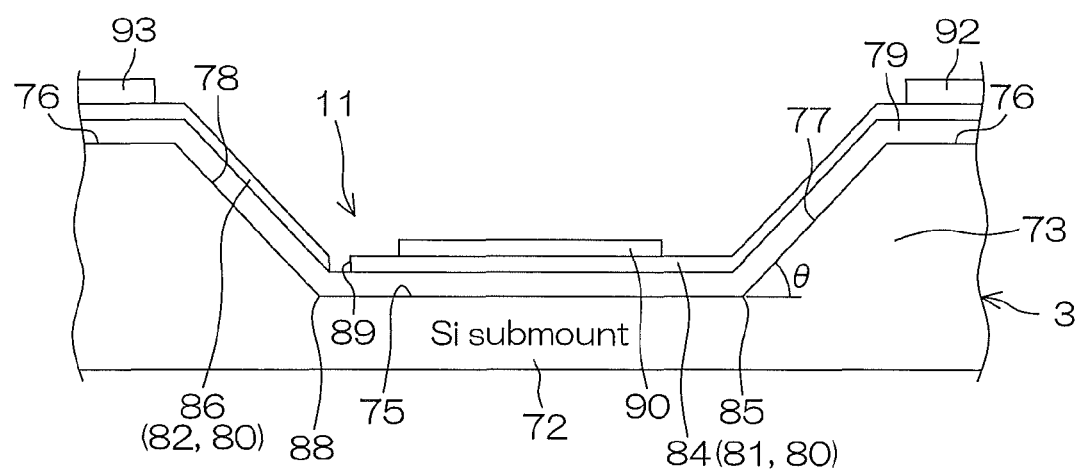
Figure 11:
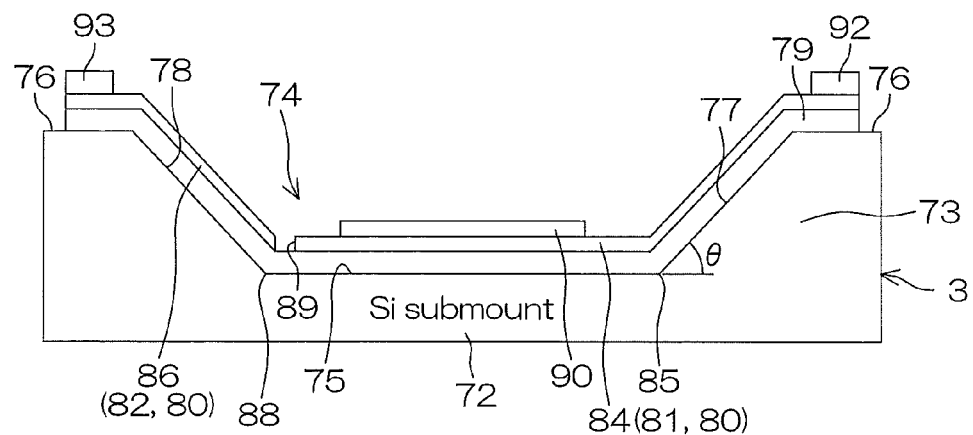
Figure 11:
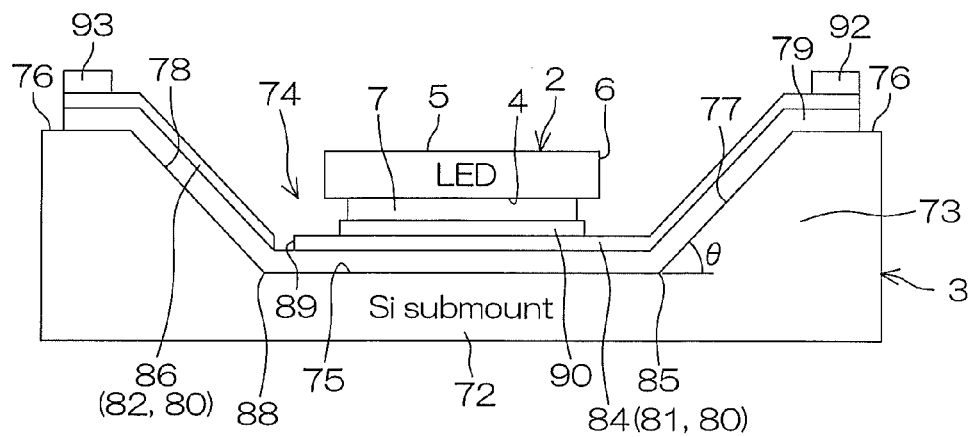

Next, as shown in FIG. 11H, a negative-type photoresist (not illustrated) is applied onto the entire surface of the Si submount 3, and the negative-type photoresist is patterned to have openings in regions in which the anode bonding layer 90, the anode terminal layer 92, the cathode bonding layer 91, and the cathode terminal layer 93 should be formed. Then, for example, by a sputtering method, a Ti layer and an Au layer are deposited in order on the negative-type photoresist. Thereafter, unnecessary portions of the Ti layer and the Au layer are lifted off together with the negative-type photoresist. Accordingly, the anode bonding layer 90, the anode terminal layer 92, the cathode bonding layer 91, and the cathode terminal layer 93 are formed simultaneously.

Next, as shown in FIG. 11I, portions on dicing lines set on the top surfaces 76 of the Si submount 3 of the anode side reflecting film 81, the cathode side reflecting film 82, and the insulating film 79 are selectively removed. Thereafter, the Si submount 3 is cut along the dicing lines. Accordingly, the wafer is divided into Si submounts 3.

Next, as shown in FIG. 11J, to the anode bonding layer 90 and the cathode bonding layer 91 of each divided Si submount 3, the anode electrode 7 and the cathode electrode 8 of the LED chip 2 are bonded on a one-to-one basis.

Thereafter, the recess portion 74 of the Si submount 3 is filled with the resin phosphor 26.

Through the steps described above, the LED element unit 71 shown in FIG. 10 is obtained.

With the LED element unit 71 according to the third preferred embodiment, the same operations and effects as those of the LED element unit 1 according to the first preferred embodiment are also obtained.

Further, in the LED element unit 71, the first reflecting portion 83 of the anode side reflecting film 81 and the second reflecting portion 86 of the cathode side reflecting film 82 are exposed along the inclined surfaces 77 and 78, so that lights from the side surfaces 6 of the LED chip 2 can be directly irradiated onto the reflecting films 81 and 82. Therefore, the light reflectance can be improved.

Further, the anode side reflecting film 81 has the anode connecting portion 84 integrally with the first reflecting portion 83, and is pulled out to the top surface 76 of the side wall 73 of the submount by utilizing the first reflecting portion 83. The cathode side reflecting film 82 has the cathode connecting portion 87 integrally with the second reflecting portion 86, and is pulled out to the top surface 76 of the side wall 73 of the submount by utilizing the second reflecting portion 86. Accordingly, bonding wires 25 that supply electric power to the anode and the cathode of the LED chip 2 can be connected to the top surfaces 76 (the anode terminal layer 92 and the cathode terminal layer 93) of the Si submount 3. Therefore, lights from the side surfaces 6 of the LED chip 2 can be prevented from colliding with obstacles such as wires before reaching the inclined surfaces 77 and 78 (the anode side reflecting film 81 and the cathode side reflecting film 82). As a result, a loss to be caused by collision with obstacles can be reduced, so that lights from the side surfaces 6 of the LED chip 2 can be more efficiently extracted.

Specifically, in the LED element unit 71, the anode side reflecting film 81 and the cathode side reflecting film 82 exposed inside the recess portion 74 commonly serve as an anode wiring and a cathode wiring, respectively. Accordingly, an effect of improvement in reflectance according to exposure of the reflecting films 81 and 82 and an effect of reduction in loss of light according to the laying of wirings from the bottom surface 75 to the top surfaces 76 of the side walls 73 of the Si submount 3 can be realized simultaneously. Therefore, unlike the Si submounts 3 according to the first and second preferred embodiments, even if the light reflecting film 80 is not formed to surround the LED chip 2, light can be efficiently extracted.

The anode terminal layer 92 and the cathode terminal layer 93 are disposed at positions near objects to which these terminal layers are electrically connected (the object to which the anode terminal layer 92 is connected is the anode bonding layer 90, and the object to which the cathode terminal layer 93 is connected is the cathode bonding layer 91) so that they become diagonal to each other. Therefore, a voltage drop until the electric power supplied from the bonding wires 25 reaches the anode and the cathode of the LED chip 2 can be reduced.

Like the LED element unit 1 according to the first preferred embodiment, the LED element unit 71 according to the third preferred embodiment can also be utilized for various LED packages and various LED illuminations.

Although preferred embodiments of the present invention have been described above, the present invention can also be carried out in other embodiments.

For example, it is also possible that the surface 4 of the LED chip 2 is the light extracting surface, and the LED chip 2 is supported by the Si submount 3 in a face-up position in which the surface 4 (light extracting surface) is directed upward.

The preferred embodiments of the present invention are just detailed examples used for clarifying the technical contents of the present invention, and the present invention should not be interpreted as being limited to detailed examples, and the spirit and scope of the present invention shall be limited only by the accompanying claims.

The present application corresponds to Japanese Patent Application No. 2010-293739 filed in Japan Patent Office on Dec. 28, 2010, the whole disclosure of which is incorporated herein by reference.

What is claimed is:

1. A light emitting element module, comprising:
   a substrate having a recess portion including a bottom surface and an inclined portion arranged such that the bottom surface is sandwiched between parts of the inclined portion in a plan view, the bottom surface and the inclined portion being integrally formed by an Si material;
   a metal film formed on the inclined portion of the substrate such that the metal film covers a peripheral edge portion of the recess portion on a top surface of the inclined portion, the metal film being spaced from the bottom surface of the substrate such that the metal film is free of overlapping with the bottom surface of the substrate in a thickness direction of the substrate;
   a first electrode formed on the bottom surface of the substrate;
   a second electrode formed on the bottom surface of the substrate, the second electrode having a plane area greater than a plane area of the first electrode;
   a light emitting element chip provided on the bottom surface of the substrate such that the light emitting element chip is electrically connected to the first electrode and the second electrode, the light emitting element chip being electrically isolated from the metal film;
   a first electrode portion integrally formed with the first electrode in the recess portion, the first electrode portion including a region which is not overlapped with the light emitting element chip in a plan view; and
   a second electrode portion integrally formed with the second electrode in the recess portion, the second electrode portion including a region which is not overlapped with the light emitting element chip in the plan view.

2. The light emitting element module according to claim 1, wherein each of the first and second electrodes is spaced from the inclined portion of the substrate.

3. The light emitting element module according to claim 1, wherein the bottom surface of the substrate is surrounded by the inclined portion in the plan view.

4. The light emitting element module according to claim 3, wherein the inclined portion of the substrate has tetragonal ring shape in the plan view surrounding the bottom surface of the substrate.

5. The light emitting element module according to claim 1, wherein a rear surface of the light emitting element is spaced from the bottom surface of the substrate.

6. The light emitting element module according to claim 1, wherein a rear surface of the light emitting element is positioned at a height level higher than an end portion of the metal film close to the bottom surface of the substrate.

7. The light emitting element module according to claim 1, further comprising:
   a first wire directly connected to the first electrode portion and electrically connected to the first electrode via the first electrode portion; and
   a second wire directly connected to the second electrode portion and electrically connected to the second electrode via the second electrode portion.

8. The light emitting element module according to claim 1, further comprising an insulating film arranged between the first and second electrodes, and the bottom surface of the substrate.

9. The light emitting element unit according to claim 1, wherein the inclined portion is inclined at an angle in a range of 30 to 80 degrees with respect to the bottom surface.

10. The light emitting element unit according to claim 1, wherein the inclined portion is inclined at an angle in a range of 40 to 70 degrees with respect to the bottom surface.

11. The light emitting element unit according to claim 1, wherein the inclined portion is inclined at an angle in a range of 45 to 65 degrees with respect to the bottom surface.

12. The light emitting element unit according to claim 1, wherein the inclined portion is inclined at an angle in a range of 50 to 60 degrees with respect to the bottom surface.

13. The light emitting element unit according to claim 1, wherein the inclined portion is inclined at an angle in a range of 53 to 57 degrees with respect to the bottom surface.

* * * * *